United States Patent
Norizuki et al.

(10) Patent No.: US 10,192,877 B2
(45) Date of Patent: Jan. 29, 2019

(54) THREE-DIMENSIONAL MEMORY DEVICE WITH LEVEL-SHIFTED STAIRCASE STRUCTURES AND METHOD OF MAKING THEREOF

(71) Applicant: SANDISK TECHNOLOGIES LLC, Plano, TX (US)

(72) Inventors: Naoto Norizuki, Yokkaichi (JP); Yasuchika Okizumi, Yokkaichi (JP); Shogo Mada, Yokkaichi (JP); Hiroyuki Ogawa, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/451,773

(22) Filed: Mar. 7, 2017

(65) Prior Publication Data
US 2018/0261611 A1 Sep. 13, 2018

(51) Int. Cl.
H01L 27/11551 (2017.01)
H01L 27/11548 (2017.01)
(Continued)

(52) U.S. Cl.
CPC .. *H01L 27/11548* (2013.01); *H01L 21/31144* (2013.01); *H01L 27/11519* (2013.01);
(Continued)

(58) Field of Classification Search
CPC ......... H01L 27/11548; H01L 21/31144; H01L 27/11565; H01L 27/11519;
(Continued)

(56) References Cited

U.S. PATENT DOCUMENTS 5,915,167 A 6/1999 Leedy
7,936,004 B2 * 5/2011 Kito .................... H01L 21/8221
257/324
(Continued)

FOREIGN PATENT DOCUMENTS

EP 3021360 A1 5/2016
KR 20100109745 A 10/2010
KR 20110021444 A 3/2011

OTHER PUBLICATIONS

International Search Report and Written Opinion of the International Searching Authority for International Patent Application No. PCT/US2017/063075, dated Mar. 8, 2018, 18 pages.
(Continued)

*Primary Examiner* — Bitew A Dinke
(74) *Attorney, Agent, or Firm* — The Marbury Law Group PLLC

(57) ABSTRACT

A mesa structure is formed over a substrate. An alternating stack of insulating layers and spacer material layers having a total height of approximately double the height of the mesa structure is formed over the substrate and the mesa structure. The spacer material layers are formed as, or are replaced with, electrically conductive layers. Portions of the alternating stack are removed from above the mesa structure by a planarization process. Stepped surfaces can be concurrently formed in a first terrace region overlying the mesa structure and in a second terrace region located at an opposite side of a memory array region of the alternating stack. A pair of level shifted stepped surfaces is formed. Contacts to the alternating stack can reach down only to the lowest surface of the pair of level shifted stepped surfaces, and can be shorter than the alternating stack.

20 Claims, 27 Drawing Sheets

(51) Int. Cl.
*H01L 27/11556* (2017.01)
*H01L 27/11575* (2017.01)
*H01L 27/11582* (2017.01)
*H01L 27/11519* (2017.01)
*H01L 27/11565* (2017.01)
*H01L 21/311* (2006.01)

(52) U.S. Cl.
CPC .. *H01L 27/11556* (2013.01); *H01L 27/11565* (2013.01); *H01L 27/11575* (2013.01); *H01L 27/11582* (2013.01)

(58) Field of Classification Search
CPC ......... H01L 27/11575; H01L 27/11556; H01L 27/11582; H01L 27/11551
See application file for complete search history.

(56) References Cited

U.S. PATENT DOCUMENTS

| | | | |
|---|---|---|---|
| 8,187,932 B2 | 5/2012 | Nguyen et al. | |
| 8,363,481 B2* | 1/2013 | Kidoh | H01L 21/8221 257/324 |
| 8,394,716 B2 | 3/2013 | Hwang et al. | |
| 8,520,425 B2 | 8/2013 | Xiao et al. | |
| 8,587,052 B2* | 11/2013 | Yun | H01L 29/66833 257/315 |
| 8,592,912 B2* | 11/2013 | Hwang | H01L 27/0207 257/314 |
| 8,884,357 B2 | 11/2014 | Wang et al. | |
| 8,946,023 B2 | 2/2015 | Makala et al. | |
| 8,981,567 B2* | 3/2015 | Hu | H01L 21/768 257/315 |
| 9,165,774 B2* | 10/2015 | Oh | H01L 21/28008 |
| 9,196,628 B1* | 11/2015 | Chen | H01L 27/11582 |
| 9,230,905 B2 | 1/2016 | Takaki et al. | |
| 9,230,987 B2 | 1/2016 | Pachamuthu et al. | |
| 9,236,392 B1* | 1/2016 | Izumi | H01L 27/11573 |
| 9,343,507 B2 | 5/2016 | Takaki et al. | |
| 9,356,034 B1* | 5/2016 | Yada | H01L 27/11575 |
| 9,449,924 B2 | 9/2016 | Takaki | |
| 9,502,332 B2* | 11/2016 | Lim | H01L 23/48 |
| 9,502,429 B2 | 11/2016 | Hironaga | |
| 9,515,023 B2 | 12/2016 | Tobitsuka et al. | |
| 9,716,062 B2* | 7/2017 | Yada | H01L 23/5226 |
| 2008/0099819 A1* | 5/2008 | Kito | G11C 16/10 257/315 |
| 2008/0149913 A1 | 6/2008 | Tanaka et al. | |
| 2009/0230449 A1* | 9/2009 | Sakaguchi | H01L 27/0688 257/298 |
| 2010/0090188 A1 | 4/2010 | Futatsuyama | |
| 2010/0254191 A1* | 10/2010 | Son | H01L 27/0207 365/185.05 |
| 2011/0204420 A1* | 8/2011 | Kim | H01L 27/0688 257/211 |
| 2011/0316072 A1* | 12/2011 | Lee | H01L 27/11551 257/329 |
| 2012/0193705 A1* | 8/2012 | Lim | G11C 5/025 257/330 |
| 2012/0195128 A1 | 8/2012 | Fujiwara et al. | |
| 2012/0256247 A1 | 10/2012 | Alsmeier | |
| 2013/0270714 A1 | 10/2013 | Lee et al. | |
| 2014/0021632 A1* | 1/2014 | Lee | G11C 5/063 257/774 |
| 2014/0054787 A1* | 2/2014 | Eun | H01L 27/11548 257/773 |
| 2014/0061776 A1* | 3/2014 | Kwon | H01L 21/8239 257/329 |
| 2014/0183756 A1* | 7/2014 | Hwang | H01L 29/7889 257/774 |
| 2014/0264898 A1 | 9/2014 | Hu et al. | |
| 2015/0069616 A1* | 3/2015 | Oh | H01L 23/48 257/773 |
| 2015/0179577 A1 | 6/2015 | Tobitsuka et al. | |
| 2015/0179659 A1 | 6/2015 | Takaki et al. | |
| 2015/0325587 A1 | 11/2015 | Chen | |
| 2015/0340366 A1* | 11/2015 | Lim | G11C 5/025 257/401 |
| 2016/0148835 A1 | 5/2016 | Shimabukuro et al. | |
| 2016/0204117 A1 | 7/2016 | Liu et al. | |
| 2016/0358855 A1* | 12/2016 | Oh | H01L 23/5226 |
| 2017/0077139 A1* | 3/2017 | Iguchi | H01L 27/11582 |

OTHER PUBLICATIONS

Endoh et al., "Novel Ultra High Density Memory with a Stacked-Surrounding Gate Transistor (S-SGT) Structured Cell," IEDM Proc. (2001) 33-36.
Invitation to Pay Additional Fees and Search Report from the European Patent Office received in connection with International Application No. PCT/US2014/071397; dated Mar. 26, 2015.
International Search Report for PCT/US2014/071397, dated Mar. 18, 2015 (5 pages).
Written Opinion of the International Searching Authority for PCT/US2014/071397, dated Mar. 18, 2015 (11 pages).
International Preliminary Report on Patentability for International Application No. PCT/US2014/071397, 12 pages, dated Jun. 21, 2016.
Non-Final Office Action for corresponding U.S. Appl. No. 14/643,211, filed Mar. 10, 2015, dated Apr. 4, 2016, containing 22 pages.
U.S. Appl. No. 15/251,374, filed Aug. 30, 2016, SanDisk Technologies LLC.
U.S. Appl. No. 15/367,791, filed Dec. 2, 2016, SanDisk Technologies LLC.

* cited by examiner

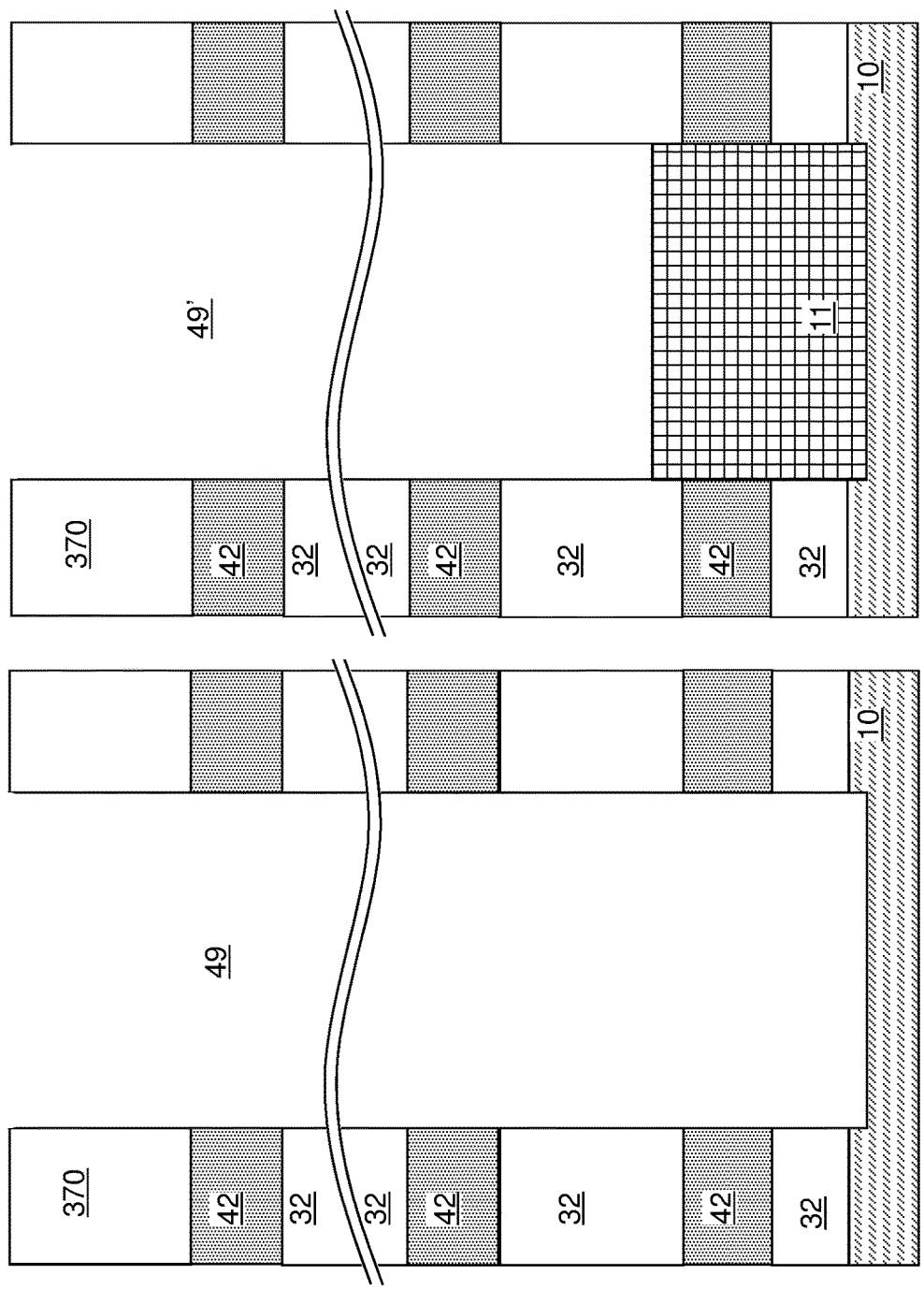

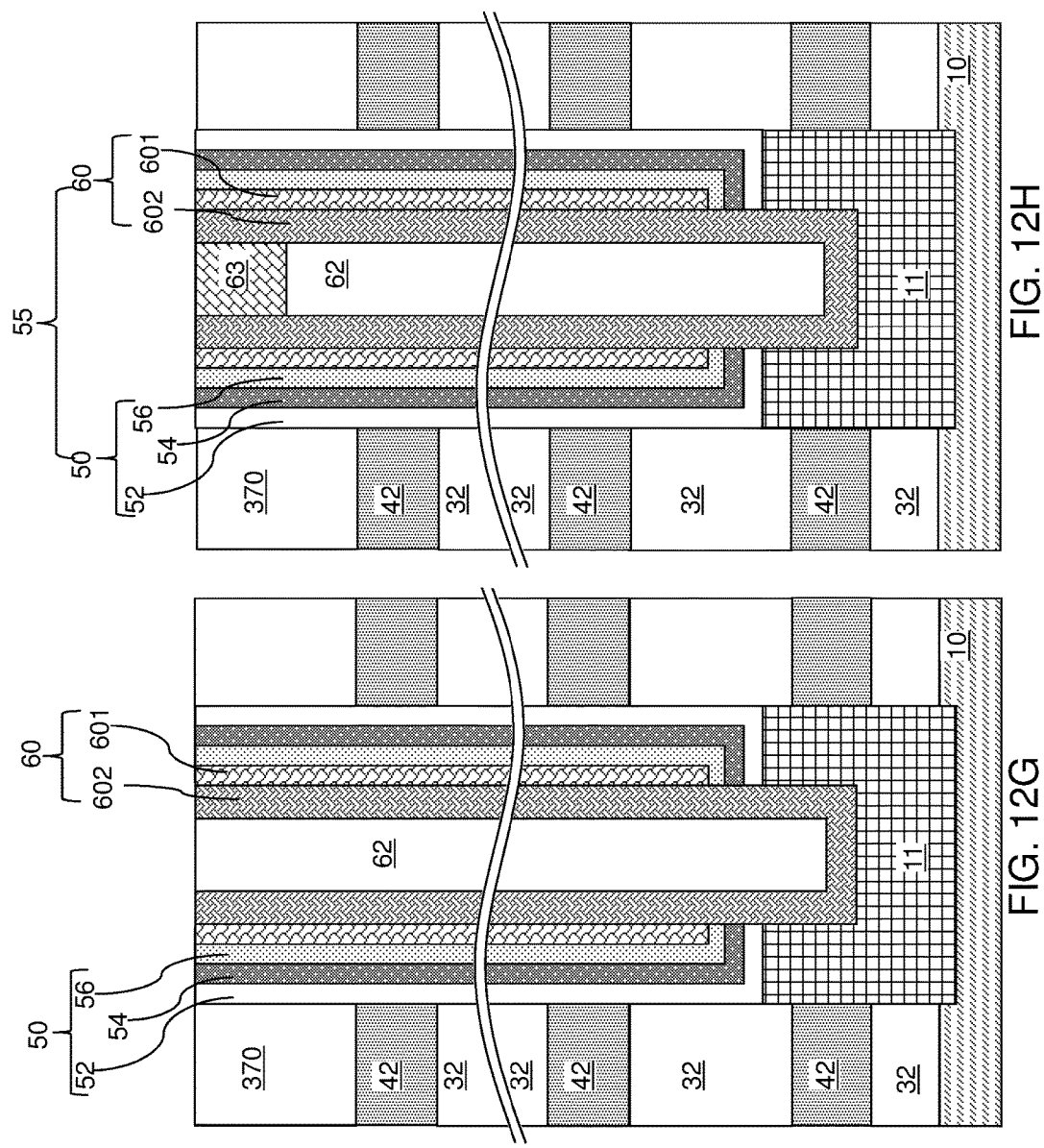

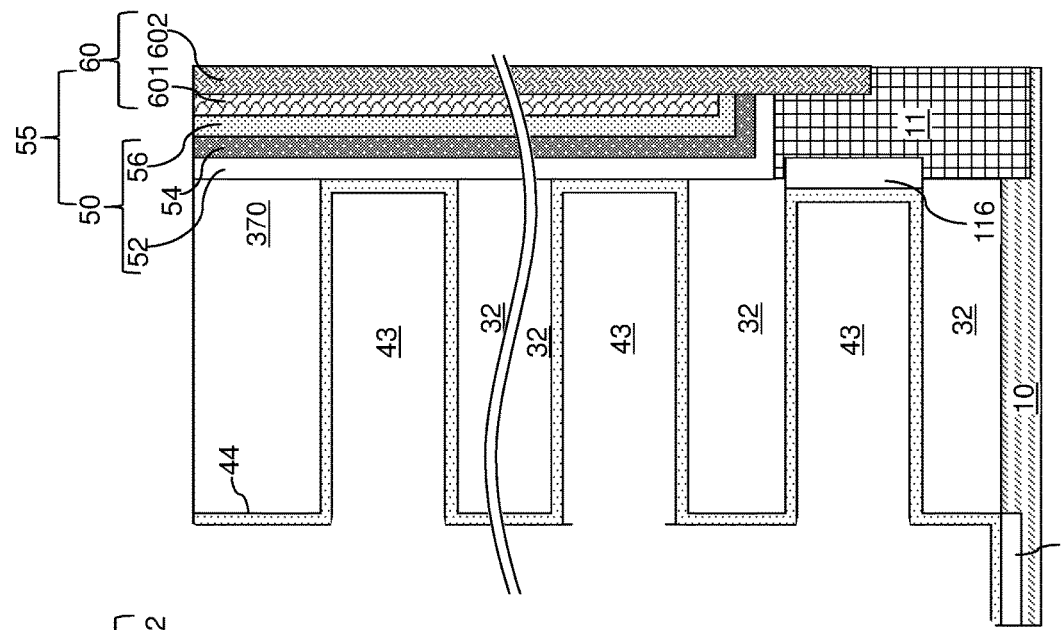
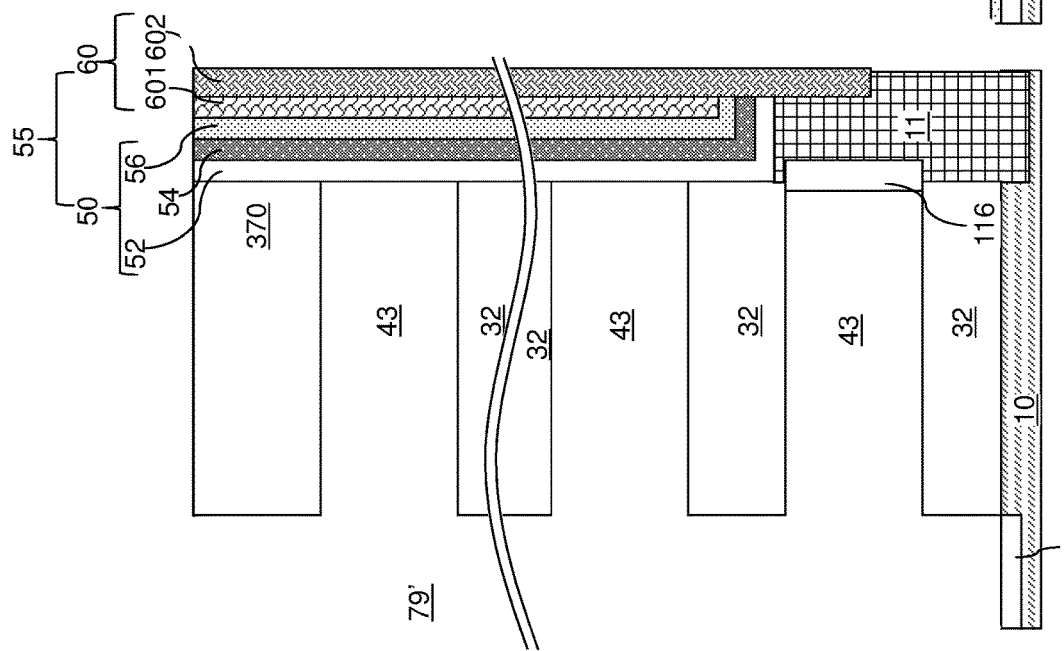

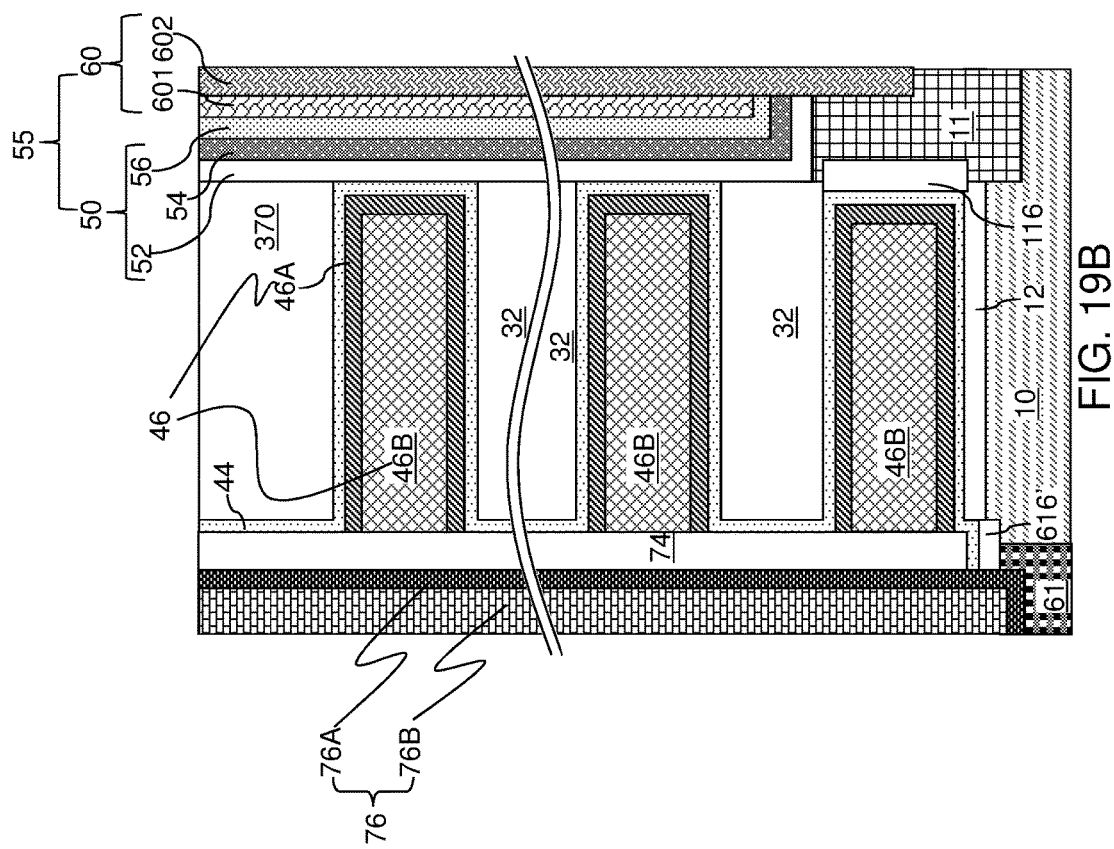

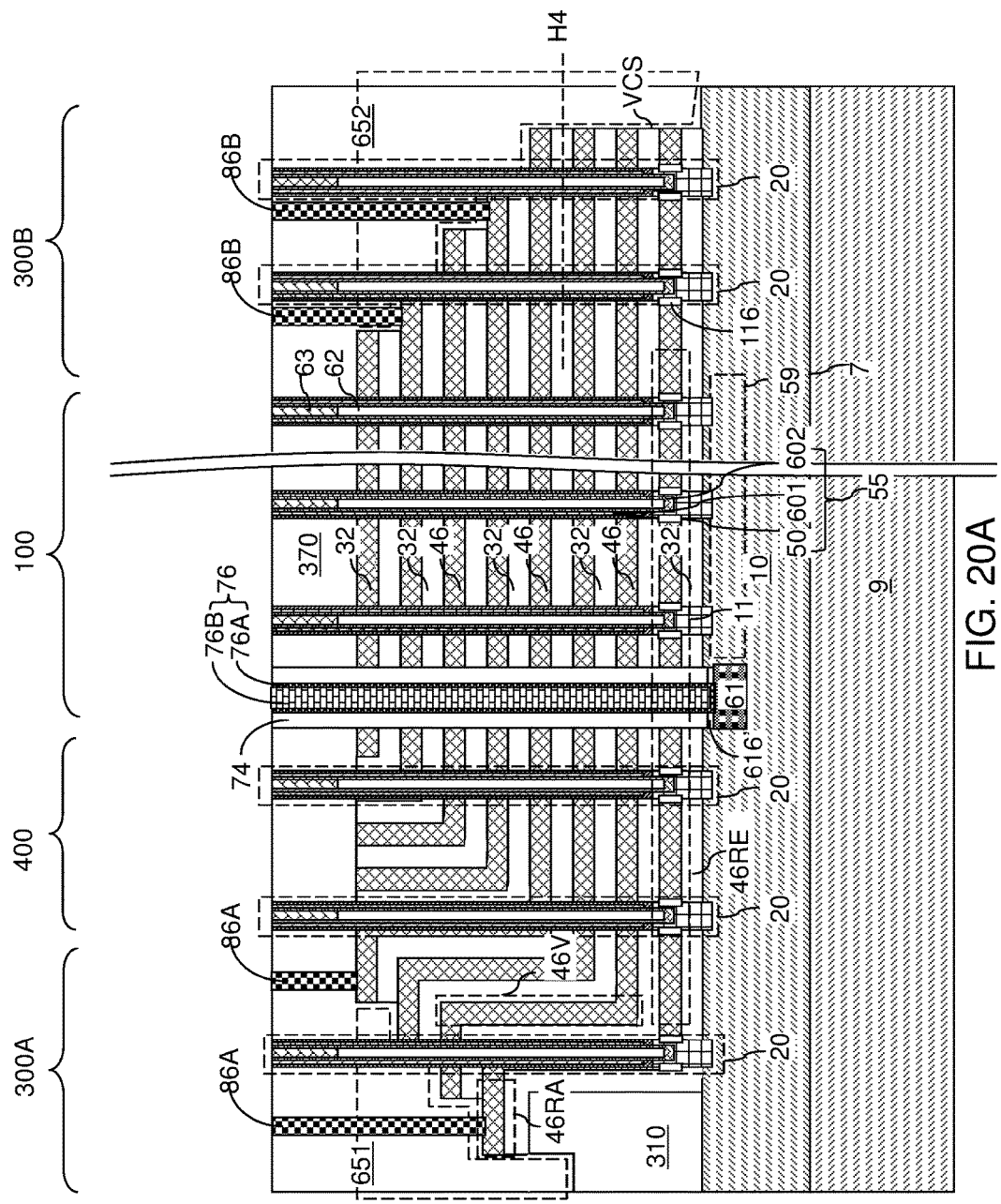

THREE-DIMENSIONAL MEMORY DEVICE WITH LEVEL-SHIFTED STAIRCASE STRUCTURES AND METHOD OF MAKING THEREOF

FIELD

The present disclosure relates generally to the field of semiconductor devices, and particular to a three-dimensional memory device employing level-shifted staircase structure for contacting word lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate, wherein the alternating stack is composed of, from bottom to top, a first contiguous subset of layers within the alternating stack and a second contiguous subset of layers; a mesa structure located over the substrate; memory stack structures extending through the alternating stack in a memory array region, wherein each of the memory stack structures comprises a memory film and a vertical semiconductor channel; a first terrace region located above the mesa structure at a first side of the memory array region, and including first stepped surfaces of the first contiguous subset; a second terrace region located at a second side of the memory array region, and including second stepped surfaces of the second contiguous subset; first contact via structures contacting respective electrically conductive layers within the first contiguous subset in the first terrace region; and second contact via structures contacting respective electrically conductive layers within the second contiguous subset in the second terrace region. According to an aspect of the present disclosure, a three-dimensional memory device is provided, which comprises: an alternating stack of insulating layers and word line layers located over a substrate, wherein the word line layers comprise upper word line layers and lower word line layer located under the upper word line layers in a memory array region, a mesa structure located over the substrate in a first contact region, memory stack structures extending through the alternating stack in the memory array region, wherein each of the memory stack structures comprises a memory film and a vertical semiconductor channel, a first terrace region located above the mesa structure in the first contact region at a first side of the memory array region, and including first stepped surfaces containing respective horizontal surfaces of the lower word line layers; and first word line contact via structures contacting the respective horizontal surfaces of the lower word line layers in the first terrace region.

According to another aspect of the present disclosure, a method of forming a three-dimensional memory device is provided. A mesa structure is formed over a substrate. An alternating stack of insulating layers and spacer material layers is formed over the substrate and the mesa structure. The alternating stack is composed of, from bottom to top, a first contiguous subset of layers within the alternating stack and a second contiguous subset of layers. The spacer material layers are formed as, or are subsequently replaced with, electrically conductive layers. Memory stack structures are formed through a memory array region of the alternating stack. First stepped surfaces that include horizontal and non-horizontal connecting surfaces (which may be vertical surfaces) of the first contiguous subset are formed above the mesa structure and in a first terrace region at a first side of the memory array region. Second stepped surfaces that include horizontal and non-horizontal connecting surfaces (which may be vertical surfaces) of the second contiguous subset are formed in a second terrace region at a second side of the memory array region. A first retro-stepped dielectric material portion is formed over the first stepped surfaces and the mesa structure, and a second retro-stepped dielectric material portion is formed over the second stepped surfaces. First contact via structures are formed through the first retro-stepped dielectric material portion and in contact with horizontal portions of the first stepped surfaces, and second contact via structures are formed through the second retro-stepped dielectric material portion and in contact with horizontal portions of the second stepped surfaces.

BRIEF DESCRIPTION OF THE DRAWINGS

FIGS. 12A-12H are sequential schematic vertical cross-sectional views of a memory opening within the exemplary structure up to the processing step of deposition of a second semiconductor channel layer according to an embodiment of the present disclosure.

FIGS. 16A-16D are sequential vertical cross-sectional views of a region of the exemplary structure during formation of electrically conductive layers according to an embodiment of the present disclosure.

FIG. 19B is a magnified view of a region of the exemplary structure of FIG. 19A.

FIG. 20A is a schematic vertical cross-sectional view of the exemplary structure after formation of additional contact via structures according to an embodiment of the present disclosure.

DETAILED DESCRIPTION

Figure 1:
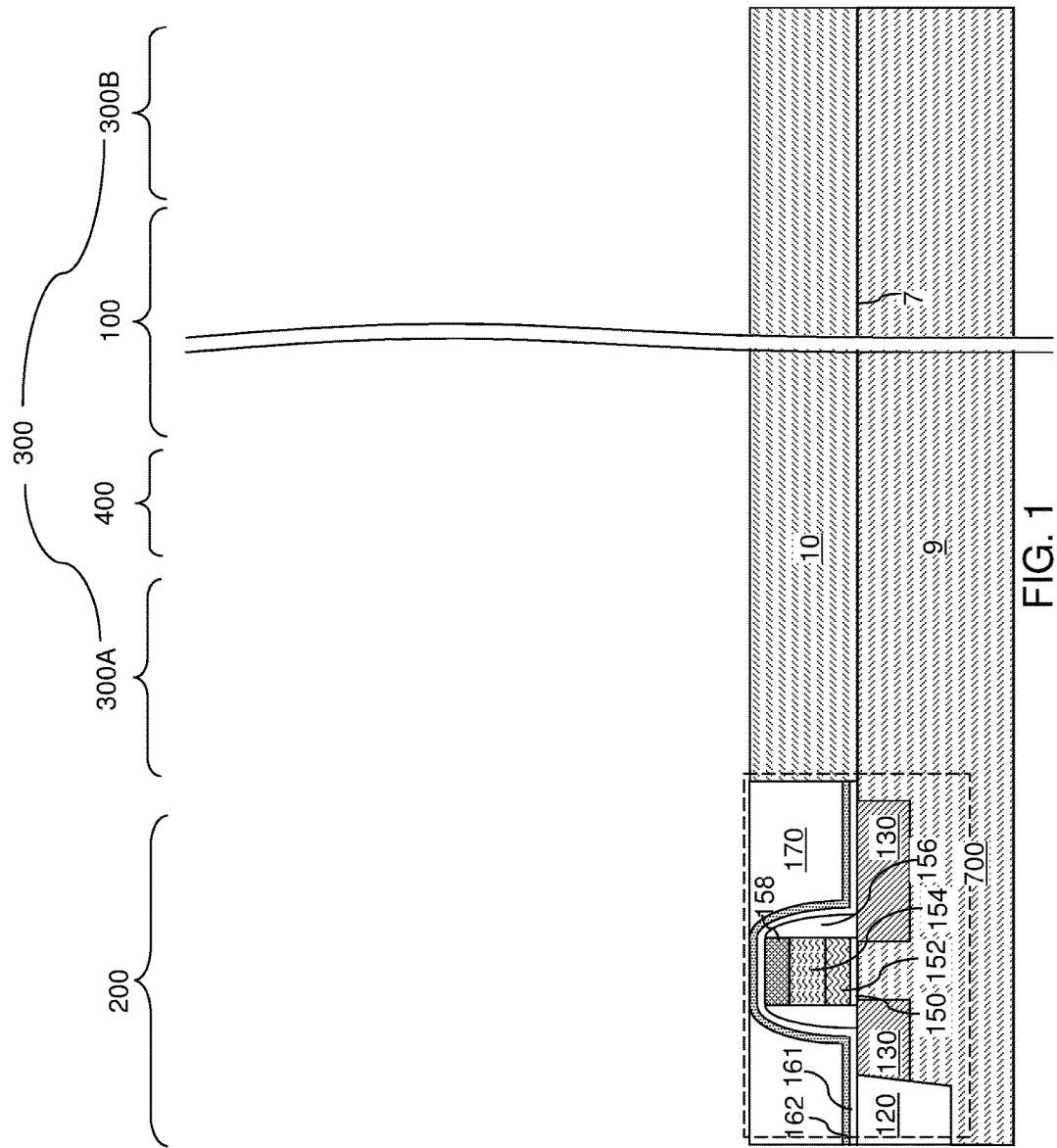
FIG. 1 is a schematic vertical cross-sectional view of an exemplary structure after formation of at least one peripheral device and a semiconductor material layer according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate (9, 10) can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-6}$ S/cm to $1.0\times10^5$ S/cm. As used herein, a "semiconductor material" refers to a material having electrical conductivity in the range from $1.0\times10^{-6}$ S/cm to $1.0\times10^5$ S/cm in the absence of electrical dopants therein, and is capable of producing a doped material having electrical conductivity in a range from 1.0 S/cm to $1.0\times10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner.

Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. A first contact region 300A in which first contact via structures are subsequently formed can be provided on one side of the memory array region 100, and a second contact region 300B in which second contact via structures are subsequently formed can be provided on another side of the memory array region 100. A transition region 400 in which vertically extending portions of layers are subsequently formed can be provided between the memory array region 100 and the first contact region 300A. The peripheral device region 200 may be provided adjacent to the first contact region 300A and/or adjacent to the second contact region 300B.

Figure 2:
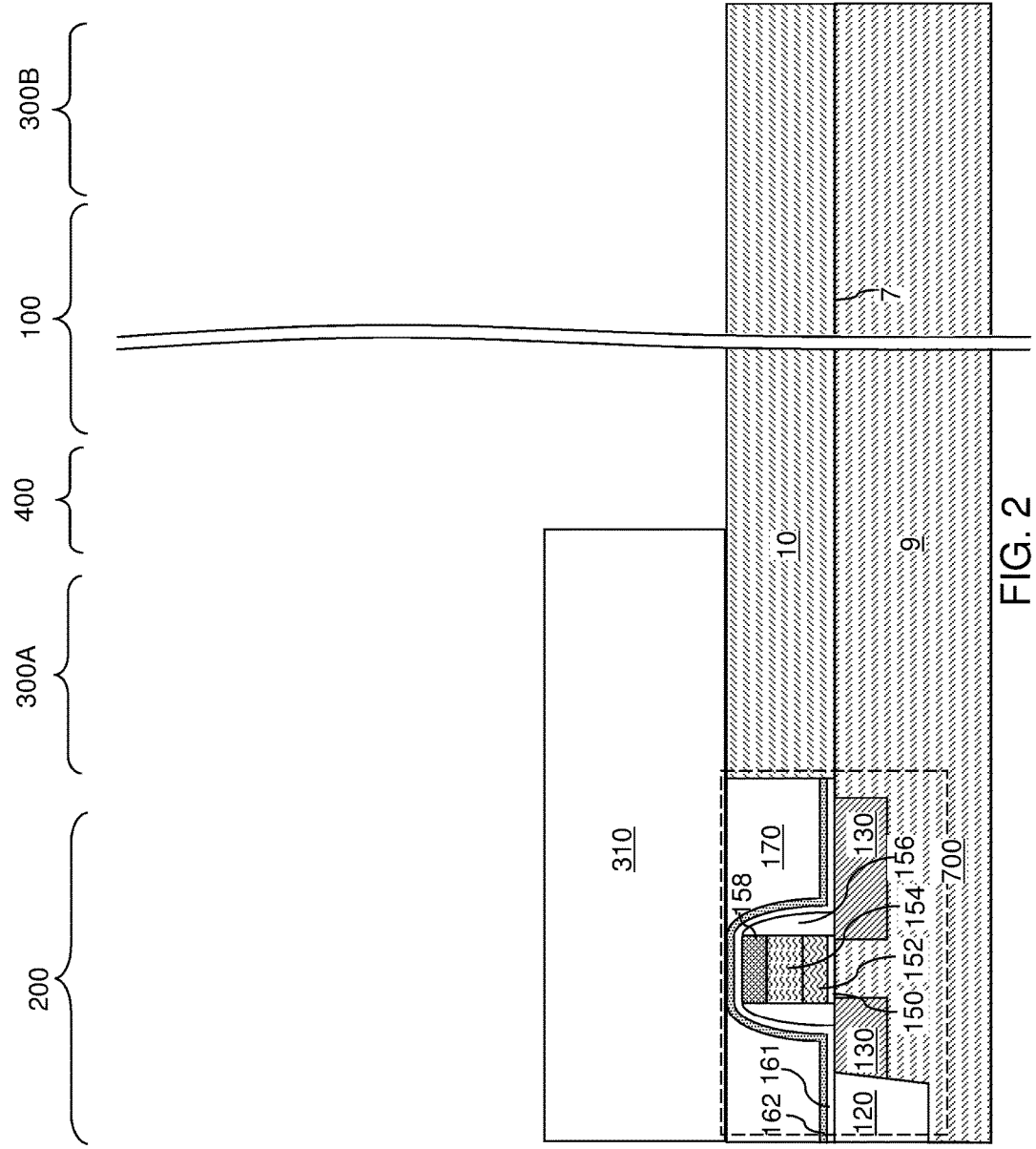
FIG. 2 is a schematic vertical cross-sectional view of an exemplary structure after formation of a dielectric mesa structure according to an embodiment of the present disclosure.

Referring to FIG. 2, a mesa structure 310, such as a dielectric mesa structure, can be formed in the first contact region 300A and over the substrate (9, 10). The dielectric mesa structure 310 may optionally extend over at least a portion of the peripheral device region 200. The dielectric mesa structure 310 can be formed, for example, by depositing a dielectric material as a planar dielectric material layer, applying and patterning a photoresist layer over the planar dielectric material layer, and etching areas of the planar dielectric material layer that are not covered by the patterned photoresist layer employing an etch process that is selective to the semiconductor material of the semiconductor material layer 10. The etch process can be an anisotropic etch process, an isotropic etch process, or a combination thereof. In one embodiment, the etch process may be an isotropic etch process, and the dielectric mesa structure 310 can be formed with vertical sidewalls that are perpendicular to the major surface 7. The dielectric material of the dielectric mesa structure 310 can include, for example, silicon oxide. Optionally, a dielectric metal oxide liner (not shown) may be employed over a silicon oxide layer to provide a planar dielectric material layer including a vertical layer stack. Alternatively, the planar dielectric material layer may consist essentially of a single homogeneous dielectric material such as silicon oxide. Alternatively, the mesa structure 310 may be made of an electrically conductive or semiconductor material. In this case, a dielectric cap (e.g., silicon oxide or metal oxide) is formed over the top of the mesa structure 310 at this stage or as the first layer of the alternating stack described below to isolate the conductive or semiconductor mesa structure 310 from the word lines to be formed above the mesa structure 310, as will be described below.

The planar dielectric material layer can be deposited by a conformal or non-conformal deposition method. For example, the planar dielectric material layer can be deposited by chemical vapor deposition. The thickness of the planar dielectric material layer, and thus, the thickness of the dielectric mesa structure 310, can be in a range from 40% to 60%, such as from 45% to 55%, of the total thickness of an alternating stack of insulating layers and spacer material layers to be subsequently formed. The planar dielectric material layer can be formed with a horizontal planar top surface, i.e., a top surface within a horizontal plane that is parallel to the top surface of the substrate (9, 10) and the major surface 7. Thus, the dielectric mesa structure 310 can include a horizontal top surface.

Figure 3:
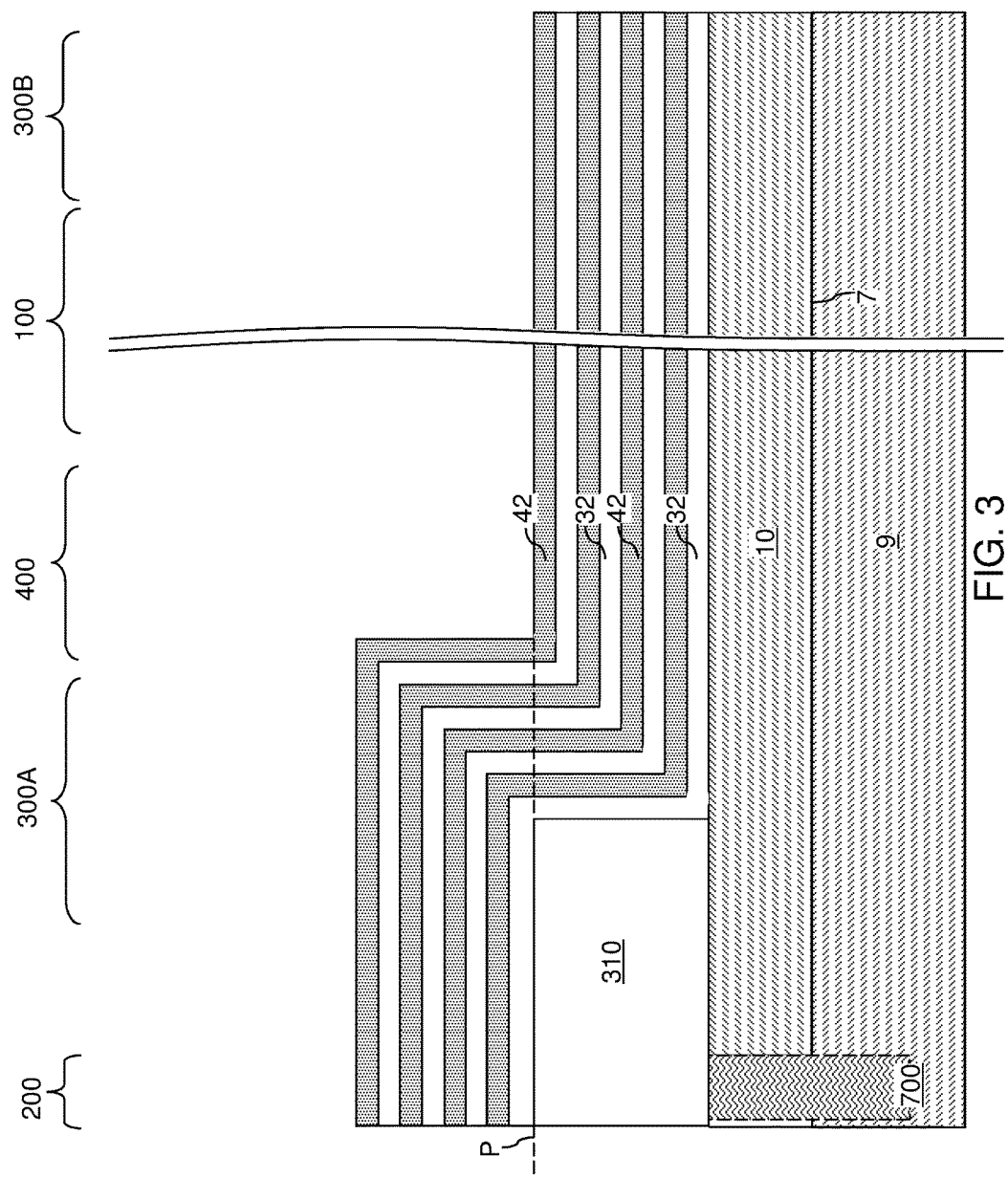
FIG. 3 is a schematic vertical cross-sectional view of the exemplary structure after formation of a first contiguous subset of an alternating stack of insulating layers and sacrificial material layers according to an embodiment of the present disclosure.

Referring to FIG. 3, a stack of an alternating plurality, i.e., an alternating stack, of first material layers (which can be insulating layers 32) and second material layers (which can be sacrificial material layer 42) is formed over the top surface of the substrate. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. FIG. 3 illustrates the exemplary structure after formation of a first contiguous subset of an alternating stack of insulating layers 32 and sacrificial material layers 42. The first contiguous subset of the alternating stack (32, 42) can correspond to approximately one half of all layers within the alternating stack (32, 42) to be completed. In other words, the first contiguous subset of the alternating stack (32, 42) can correspond to, approximately or exactly, the lower half of the alternating stack (32, 42) to be completed. In this case, a horizontal plane P including a topmost surface of the first contiguous subset of the alternating stack (32, 42) within the memory array region 100 can be at, or close to, the top surface of the dielectric mesa structure 310.

The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Figure 4:
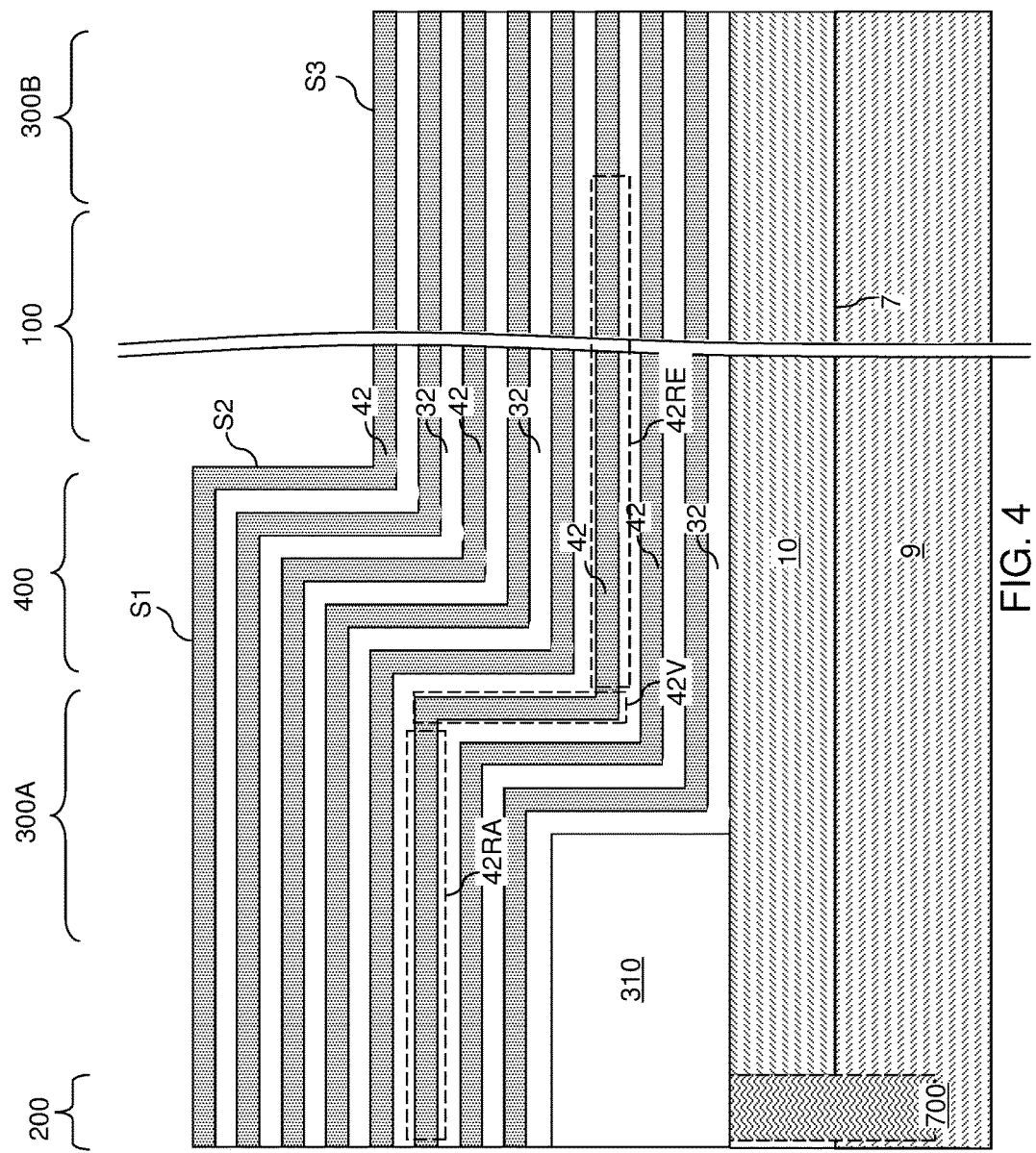
FIG. 4 is a schematic vertical cross-sectional view of the exemplary structure after formation of a second contiguous subset of an alternating stack of insulating layers and sacrificial material layers according to an embodiment of the present disclosure.

Referring to FIG. 4, a second contiguous subset of the alternating stack of insulating layers 32 and sacrificial material layers 42 is formed over the first contiguous subset of the alternating stack (32, 42). In one embodiment, the second contiguous subset can be the complementary subset of the first contiguous subset with respect to the alternating stack (32, 42). In other words, the union of the first contiguous subset and the second contiguous subset is identical to the entirety of the alternating stack (32, 42). Thus, the alternating stack (32, 42) is composed of, from bottom to top, the first contiguous subset of layers within the alternating stack (32, 42) and the second contiguous subset of layers that is the complementary subset of the first contiguous subset. Each sacrificial material layer 42 in the first subset is located below the sacrificial material layers 42 in the second subset in the memory array region 100. Each sacrificial material layer 42 in the first subset has a raised portion 42RA located over the mesa structure 310 in the first contact region 300A which is farther away from the top surface 7 of the substrate than a recessed portion 42RE of the same sacrificial material layer 42 located in the memory array region 100 to the side of the mesa structure 310. The raised portion 42RA and the recessed portion 42RE of each sacrificial material layer 42 may extend horizontally (i.e., parallel to the top surface 7 of the substrate). Each sacrificial material layer 42 in the first subset also contains a connecting portion 42V located in the transition region 400 and/or in the first contact region 300A. The connecting portion 42V may extend over the sidewall of the mesa structure 310 and connects the recessed portion 42RE to the raised portion 42RA of the same sacrificial material layer 42. The connecting portion 42V may be a non-horizontal portion, such as a vertical portion. In one embodiment, the spacer material layers may be formed as electrically conductive layers instead of sacrificial material layers 42. Generally, the spacer material layers can be formed as, or can be subsequently replaced with, electrically conductive layers. The topmost layer of the alternating stack (32, 42) includes a horizontal topmost surface S1 that extend over the dielectric mesa structure 310, a sidewall S2 adjoining an edge of the horizontal topmost surface S1, and a recessed top (e.g., horizontal) surface S3 adjoining a bottom edge of the sidewall S2 of the topmost layer. Each layer within the alternating stack (32, 42) includes a first horizontal portion extending through the memory array region 100, a vertically extending portion located in the transition region 400 or in an area of the first contact region 300A that does not overlap with the dielectric mesa structure 310, and a second horizontal portion that extends over the dielectric mesa structure 310 in region 300A.

Figure 5:
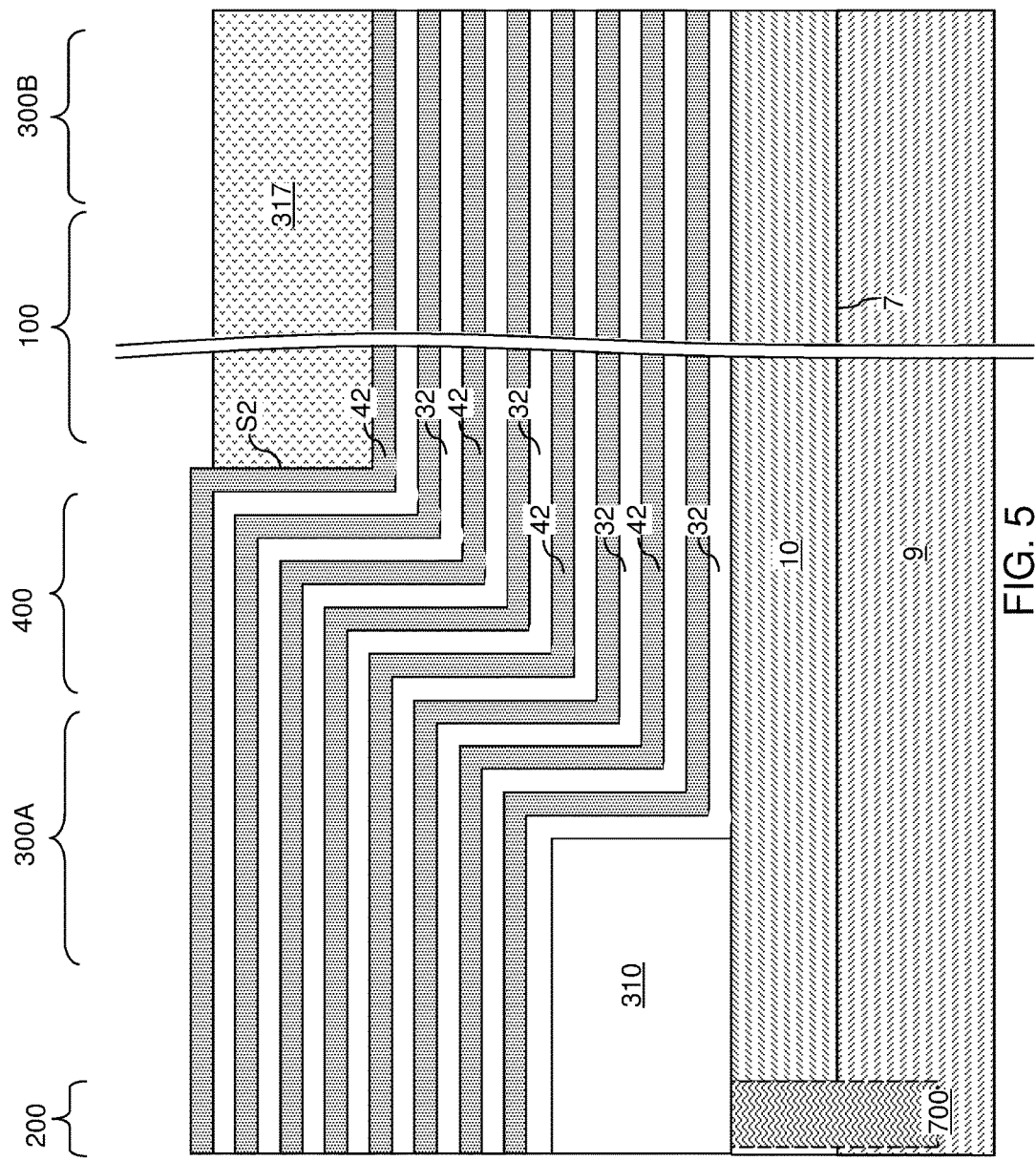
FIG. 5 is a schematic vertical cross-sectional view of the exemplary structure after formation of an optional masking material layer according to an embodiment of the present disclosure.

Referring to FIG. 5, an optional masking material layer 317 can be applied over the recessed top surface of the topmost layer of the alternating stack (32, 42). The lateral extent of the masking material layer 317 can be laterally bounded by the sidewall S2 of the topmost layer of the alternating stack (32, 42). In one embodiment, the masking material layer 317 can include a self-planarizing material such as a photoresist material or a spin-on dielectric. In another embodiment, the masking material layer 317 can be a hard mask layer (e.g., silicon nitride, aluminum oxide, metal, etc. layer) which is used as a polish stop or etch stop layer. In one embodiment, an outer edge of the masking material layer 317 can coincide with the sidewall S2 of the topmost layer of the alternating stack (32, 42). In one embodiment, the top surface of the masking material layer 317 can be within a horizontal plane located below a horizontal plane including the topmost surface of the alternating stack (32, 42) that is formed over the dielectric mesa structure 310.

Figure 6:
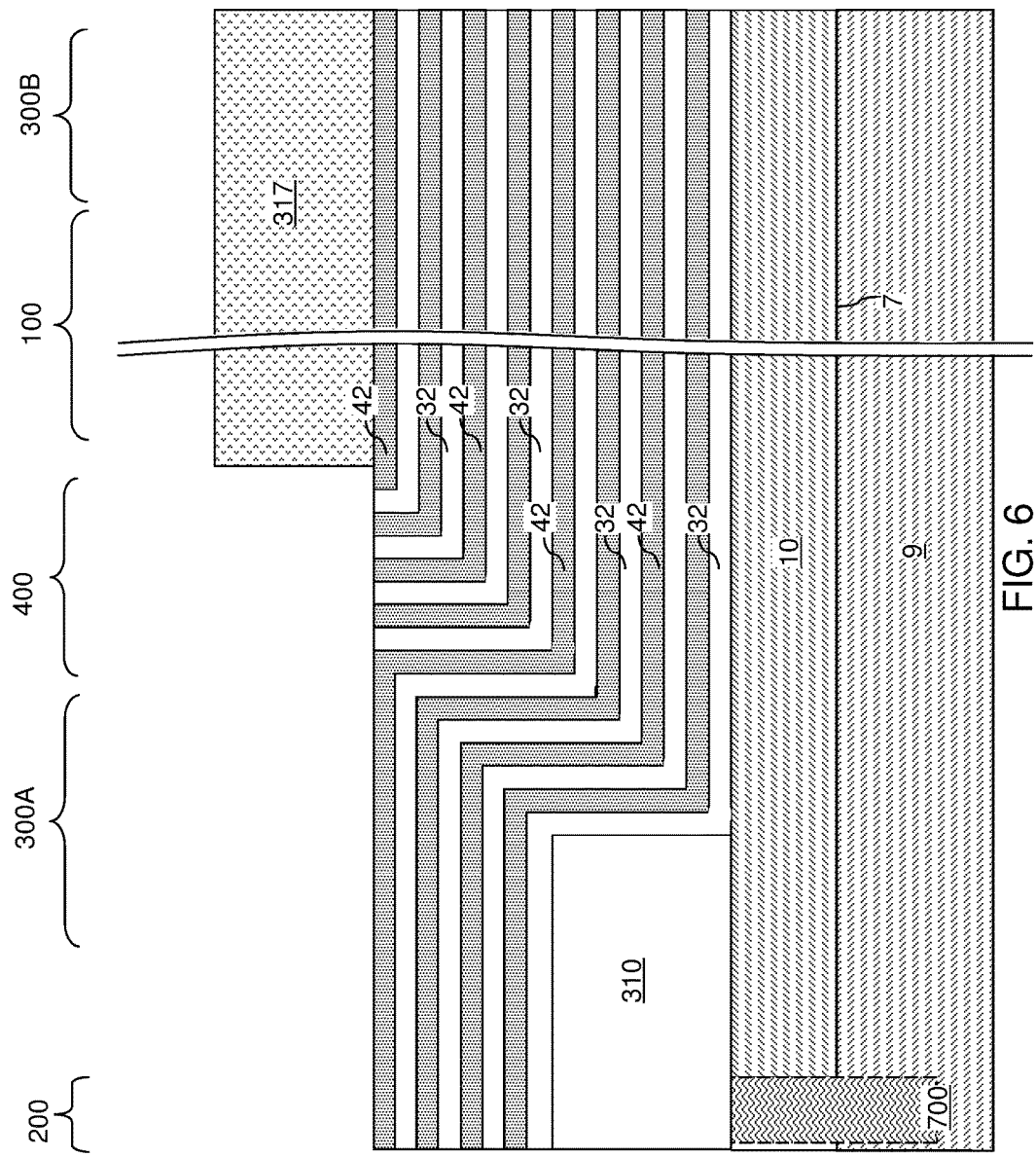
FIG. 6 is a schematic vertical cross-sectional view of the exemplary structure after recessing portions of the alternating stack according to an embodiment of the present disclosure.

Referring to FIG. 6, portions of the alternating stack (32, 42) that are not masked by the masking material layer 317 can be recessed by planarization process, such as a chemical mechanical planarization (i.e., chemical mechanical polishing) (CMP) which employs the masking material layer 317 as a polish stop or an etch process that employs the masking material layer 317 as an etch mask. The etch process can include an anisotropic etch process and/or an isotropic etch process. In one embodiment, the etch process can include multiple steps that are optimized to alternatively etch the materials of the insulating layers 32 and the sacrificial material layers 42. The duration of each etch step in the etch process can be optimized such that the topmost surface of the alternating stack (32, 42) is substantially coplanar with the horizontal interface between the alternating stack (32, 42) and the masking material layer 317 in the memory array region 100 after removal of the unmasked portions of the alternating stack (32, 42) outside the area of the masking material layer 317 by the etch process. In one embodiment, all layers of the second contiguous subset of the alternating stack (32, 42) can be removed from above the dielectric mesa structure 310, and the top surface of the topmost layer of the first contiguous subset of the alternating stack (32, 42) can be physically exposed within the first contact region 300A and the peripheral device region 200. Horizontal top surfaces of vertically extending portions of the layers within the second contiguous subset of the alternating stack (32, 42) can be physically exposed in the transition region 400.

In one embodiment, the topmost surface of the first contiguous subset of the alternating stack (32, 42) over the dielectric mesa structure 310 can be within the same horizontal plane as the interface between the alternating stack (32, 42) and the masking material layer 317 in the memory array region 100. In this case, portions of the alternating stack (32, 42) that are located above the horizontal plane including the recessed top surface of the topmost layer of the alternating stack (32, 42) in the memory array region 100 can be removed by the etch process, while portions of the alternating stack (32, 42) located below the horizontal plane including the recessed top surface of the topmost layer of the alternating stack (32, 42) are not removed due to the presence of the masking material layer 317, which functions as an etch mask during the etch process. After the etch process, the entire top surface of the alternating stack (32, 42) can be substantially planar. The masking material layer 317 can be subsequently removed, for example, by ashing. Optionally, a touch-up chemical mechanical planarization process can be provided to further planarize the entire top surface of the alternating stack (32, 42). The entirety of the top surface of the alternating stack (32, 42) can be within a horizontal plane. In an alternative embodiment, the masking material layer 317 may be omitted and the planarization may be performed by timed CMP which stops once the surface S3 in the memory array region 100 is reached. While the present disclosure is described employing an embodiment in which a sacrificial material layer 42 is a topmost layer of the alternating stack (32, 42) in the memory array region 100, embodiments are expressly contemplated herein in which an insulating layer 32 is a topmost layer of the alternating stack (32, 42) in the memory array region 100.

Figure 7:
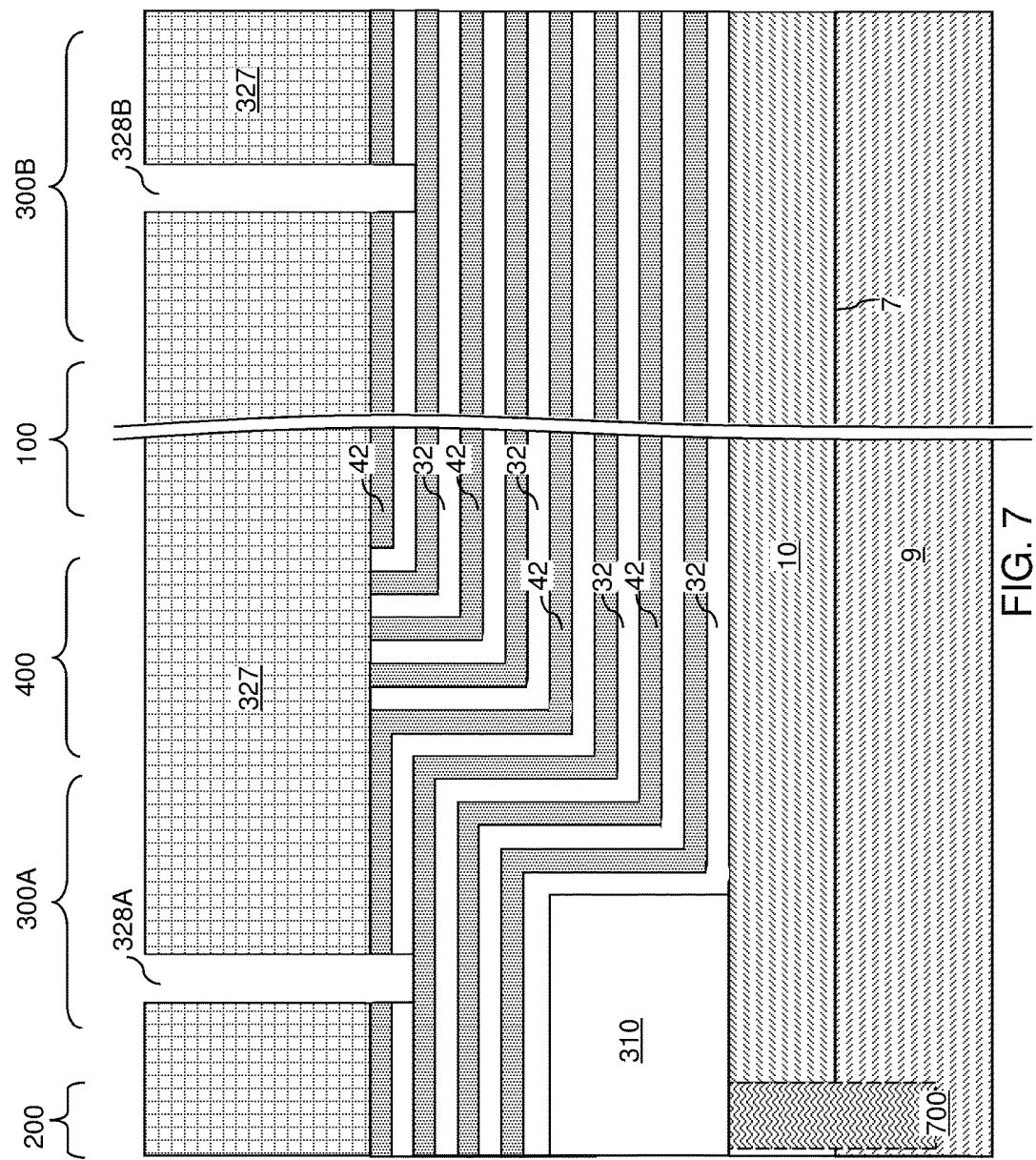
FIG. 7 is a schematic vertical cross-sectional view of the exemplary structure after formation of a patterned masking layer and an anisotropic etch process that etches a pair of a sacrificial material layer and an insulating layer within regions not masked by the patterned masking layer according to an embodiment of the present disclosure.

Referring to FIG. 7, a patterned masking layer 327 can be formed over the planarized alternating stack (32, 42). The patterned masking layer 327 can be a photoresist layer that is lithographically patterned to form linear openings therein. As used herein, a "linear opening" refers to an opening having a uniform width and laterally extending along a horizontal direction, which may be a horizontal direction that is perpendicular to the vertical cross-sectional view of FIG. 7. A first linear opening 328A is formed within the first contact region 300A over the dielectric mesa structure 310. The first linear opening 328A can extend along a horizontal direction that is the same as the horizontal direction along which a sidewall of the dielectric mesa structure 310 extend in the first contact region 300A. A second linear opening 328B is formed within the second contact region 300B. In one embodiment, the first linear opening 328A can be formed at a periphery of the first contact region 300A in proximity to the peripheral device region 200. The patterned masking layer 327 is covers the entirety of the memory array region 100 and portions of the first and second contact regions (300A, 300B), in which stepped terraces are subsequently formed.

An anisotropic etch process can be performed to etch a pair of a sacrificial material layer 42 and an insulating layer 32 within regions not masked by the patterned masking layer 327. The anisotropic etch process can include multiple steps to effectively etch a sacrificial material layer 42 and an insulating layer 32 from within each area that is not masked by the patterned masking layer 327.

Figure 8:
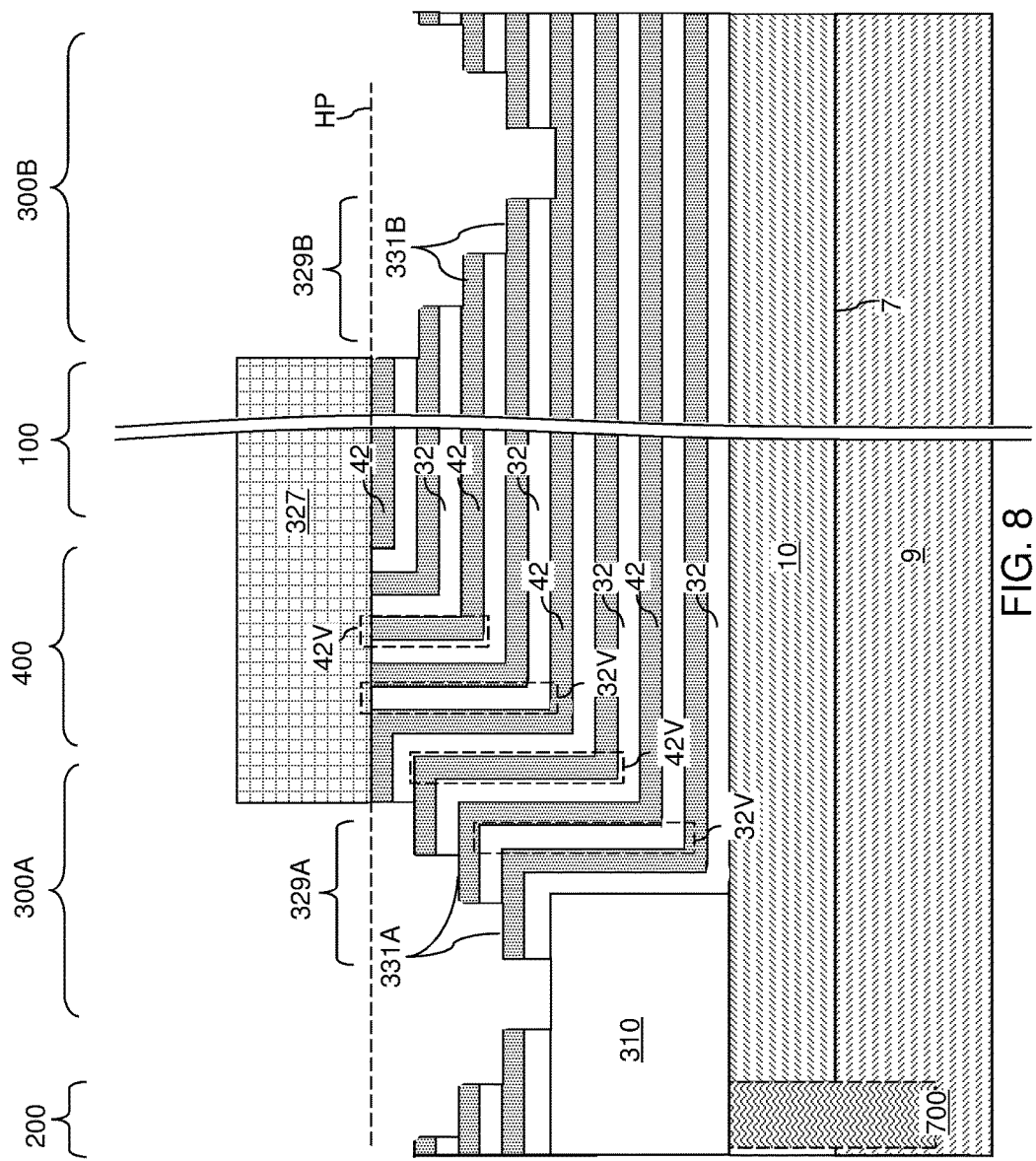
FIG. 8 is a schematic vertical cross-sectional view of the exemplary structure after formation of first stepped surfaces and second stepped surfaces according to an embodiment of the present disclosure.

Referring to FIG. 8, a set of processing steps can be repeatedly performed to form first stepped surfaces 329A in the first contact region 300A and second stepped surfaces 329B in the second contact region 300B. The first contact region 300A is also referred to as a first terrace region because the first stepped surfaces form first terraces 331A, i.e., a set of horizontal surfaces that are vertically offset from one another by non-horizontal connecting surfaces (which may be vertical surfaces) to form a first staircase structure. The second contact region 300B is also referred to as a second terrace region because the second stepped surfaces form second terraces 331B.

Each set of processing steps can include an anisotropic etch step that etches a topmost insulating layer 32 and a topmost spacer material layer (which can be a topmost sacrificial material layer 42) in each area that is not covered by the patterned masking layer 327. Each vertical step within a same opening in the patterned masking layer 327 defines an area for the purpose of identifying the topmost insulating layer 32 and the topmost spacer material layer. Specifically, the layer having a physically exposed horizontal surface between each vertical step in the first contact region 300A or in the second contact region 300B corresponds to one of the topmost insulating layer 32 and the topmost spacer material layer, and an underlying layer located immediately underneath the topmost layer having a respective physically exposed horizontal surface corresponds to another of the topmost insulating layer 32 and the topmost spacer material layer. Thus, the topmost insulating layer 32 and the topmost spacer material layer differ between the first contact area 300A and the second contact area 300B, and across each vertical step within each opening in the patterned masking layer 327. Thus, each anisotropic etch step moves the pattern of stepped surfaces downward by two layers, i.e., by the height of a vertically neighboring pair of an insulating layer 32 and a spacer material layer (such as a sacrificial material layer 42). Thus, the upper and lower sacrificial material layers 42 in the respective second and first subsets at the same time in respective first contact region 300A and second contact region 300B due to the presence of the mesa structure 310.

Further, each set of processing steps can include a trimming step that laterally trims the patterned masking layer 327 to reduce an area covered by the patterned masking layer 327. The duration of the trimming step is selected such that the lateral shift of the sidewalls of the patterned masking layer 327 during each trimming step corresponds to the width of the next horizontal step to be formed.

The number of repetition of the set of processing steps is the greater than the number of the sacrificial material layers 42 over the dielectric mesa structure 310 in the first contact region and the number of sacrificial material layers 42 located in the memory array region 100 and not extending over the dielectric mesa structure 310. The number of the sacrificial material layers 42 over the dielectric mesa structure 310 (herein referred to as a lower word line level number) can be the same as the number of sacrificial material layer 42 in the first contiguous subset of the alternating stack (32, 42), and the number of the sacrificial material layer 42 located in the memory array region 100 and not extending over the dielectric mesa structure 310 (herein referred to as an upper word line level number) can be the same as the number of sacrificial material layers 42 in the second contiguous subset of the alternating stack (32, 42). In one embodiment, the lower word line level number can be the same as the upper word line level number. For example, if the alternating stack (32, 42) includes 2N of the sacrificial material layers 42 (such as 256, 128, 64, 32, 16, etc.), the lower word line level number and the upper word line level number can be N (such as 128, 64, 32, 16, 8, etc.). Upon completion of formation of the first stepped surfaces, a top surface of the mesa structure 310 can be physically exposed or it can be covered by one or more of the alternating stack layers (32, 42). The patterned masking layer 327 can be subsequently removed, for example, by ashing.

In one embodiment, at least a portion of the first stepped surfaces can be formed over the dielectric mesa structure 310. The first stepped surfaces include horizontal and non-horizontal connecting surfaces (which may be vertical surfaces) of the first contiguous subset of the alternating stack (32, 42), and are formed above the dielectric mesa structure 310. The region of the first stepped surfaces constitutes a first terrace region, which is located at a first side of the memory array region 100. The second stepped surfaces include horizontal and non-horizontal connecting surfaces (which may be vertical surfaces) of the second contiguous subset of the alternating stack (32, 42), and are formed in the second contact region 300B that is laterally offset from the dielectric mesa structure at least by the memory array region 100. The region of the second stepped surfaces constitutes a second terrace region, which is located at a second side of the memory array region 100. In one embodiment, the second side can be an opposite side of the first side with respect to the memory array region 100. The first stepped surfaces and the second stepped surfaces are formed simultaneously.

Each sacrificial material layer 42 except a topmost sacrificial material layer 42 in the alternating stack (32, 42) includes a respective connecting portion 42V which extends non-horizontally. The non-horizontally extending connecting portion 42V can be a vertically extending portion or a portion which extends 30 to 89 degrees from the horizontal direction of the top surface 7 of the substrate. The connecting portion (e.g., vertical portion) 42V can be located within the transition region 400, within the first contact region 300A or within a combined region (300A, 400) that includes the first contact region 300A and the transition region 400 that is located between the memory array region 100 and the first contact region 300A. In one embodiment, each sacrificial material layer 42 within the second contiguous subset includes a respective vertically extending portion 42V having a planar topmost surface located within the same horizontal plane HP as the topmost surface of the alternating stack (32, 42). In one embodiment, an upper end of a vertically extending portion 42V of each sacrificial material layer 42 within the first contiguous subset can be adjoined to an upper horizontal portion located above a horizontal plane including the top surface of the dielectric mesa structure 310. In one embodiment, a lower end of the vertically extending portion 42V of each sacrificial material layer 42 within the first contiguous subset is adjoined to a lower horizontal portion that continuously extends through the memory array region 100 and into the second terrace region including the second stepped surfaces.

Each insulating layer 32 can include a respective non-horizontally extending (e.g., vertically extending) portion 32V within the first contact region 300A and/or the transition region 400 that is located between the memory array region 100 and the first contact region 300A. In one embodiment, each insulating layer 32 within the second contiguous subset includes a respective vertically extending portion 32V having a planar topmost surface located within the same horizontal plane HP as the topmost surface of the alternating stack (32, 42). In one embodiment, an upper end of a vertically extending portion 32V of each insulating layer 32 within the first contiguous subset can be adjoined to an upper horizontal portion located above a horizontal plane including the top surface of the dielectric mesa structure 310. In one embodiment, a lower end of the vertically extending portion 32V of each insulating layer 32 within the first contiguous subset is adjoined to a lower horizontal portion that continuously extends through the memory array region 100 and into the second terrace region including the second stepped surfaces.

Figure 9:
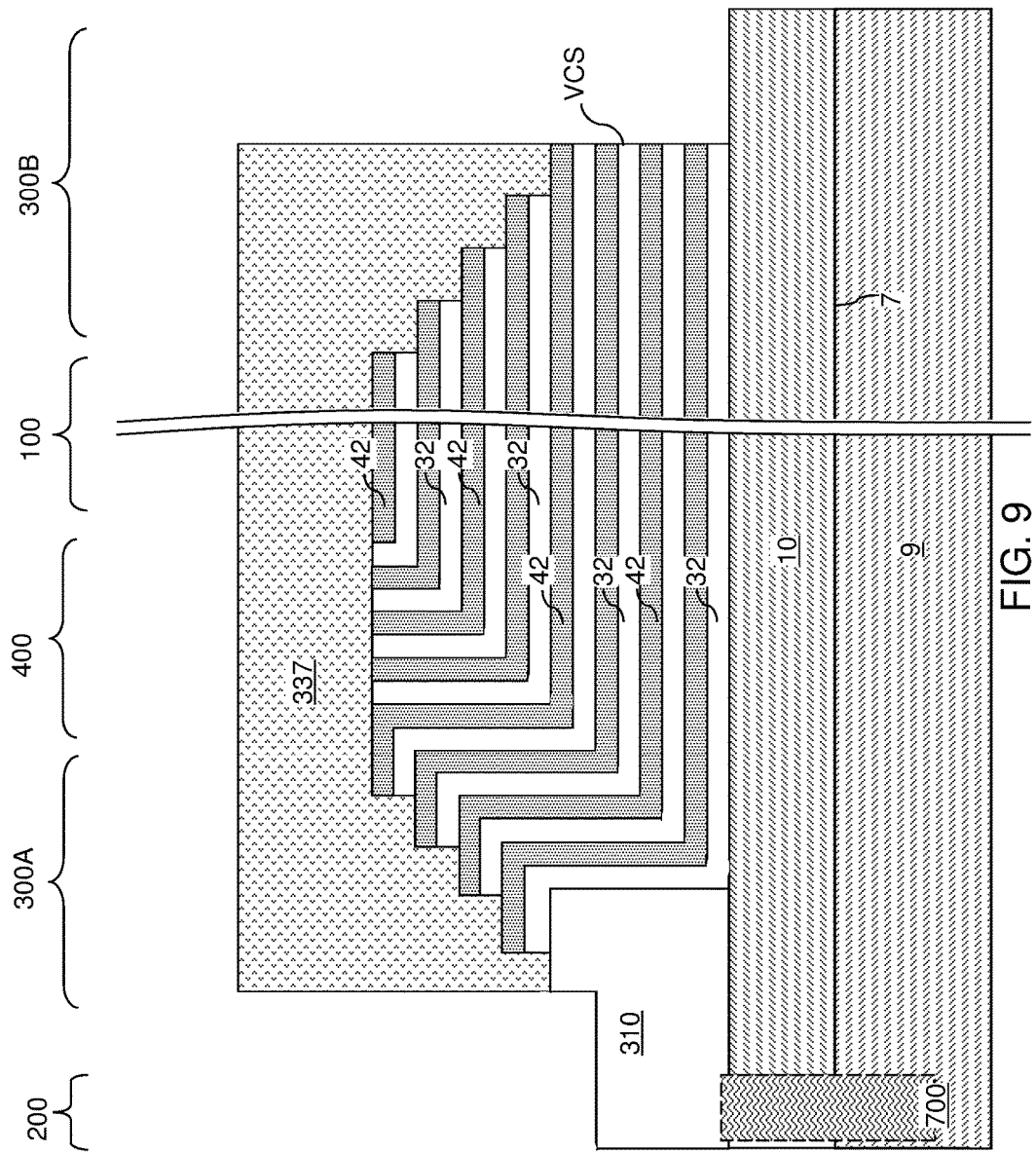
FIG. 9 is a schematic vertical cross-sectional view of the exemplary structure after optionally etching the first contiguous subset of the alternating stack outside a memory array region, a first terrace region, and a second terrace region by an anisotropic etch according to an embodiment of the present disclosure.

Referring to FIG. 9, an optional photoresist layer 337 can be applied over the exemplary structure, and can be patterned to cover the entirety of the memory array region 100, the entire area of the transition region 400, the entire area of the first contact region 300A that is more proximal to the memory array region 100 than the physically exposed areas of the dielectric mesa structure 310 is to the memory array region 100, and the entire area of the second contact region 300B that is more proximal to the memory array region 100 than the lowest physically exposed horizontal surface (i.e., the physically exposed surface that is most proximal to the substrate (9, 10)) within the second contact region 300B is to the memory array region 100. In other words, the first stepped surfaces 329A of the layers provided within the first contiguous subset of the alternating stack (32, 42) and continuously extending to the memory array region 100 are covered by the patterned photoresist layer 337. Further, the second stepped surfaces 329B of the layers provided within the second contiguous subset of the alternating stack (32, 42) and continuously extending to the memory array region 100 are covered by the patterned photoresist layer 337.

An optional etch process can be performed to remove the portions of the alternating stack (32, 42) that are not covered by the patterned photoresist layer 337. In one embodiment, the etch process can be an anisotropic etch process that is selective to the semiconductor material of the topmost portion of the substrate (9, 10) (which can be the material of the semiconductor material layer 10). In one embodiment, a vertical step may be formed in the dielectric mesa structure 310 due to collateral etching of the material of the dielectric mesa structure 310 during the anisotropic etch. The portion of the first contiguous subset of the alternating stack (32, 42) can be patterned by the anisotropic etch underneath the second stepped surfaces to form a set of sidewalls (such as the vertically coincident sidewalls VCS) of the first contiguous subset that extends from a bottom edge of the second stepped surfaces to a top surface of the substrate (9, 10). As used herein, surfaces are "vertically coincident" if the surfaces overlie or underlie one another (or each other) and if there exists a vertical plane including each of the surfaces. The patterned photoresist layer 337 can be subsequently removed, for example, by ashing. Each region overlying the first and second stepped surfaces is herein referred to as a stepped cavity, i.e., a cavity bounded by stepped surfaces at the bottom and at the side. Alternatively, the steps shown in FIGS. 8 and 9 can be omitted.

Figure 10:
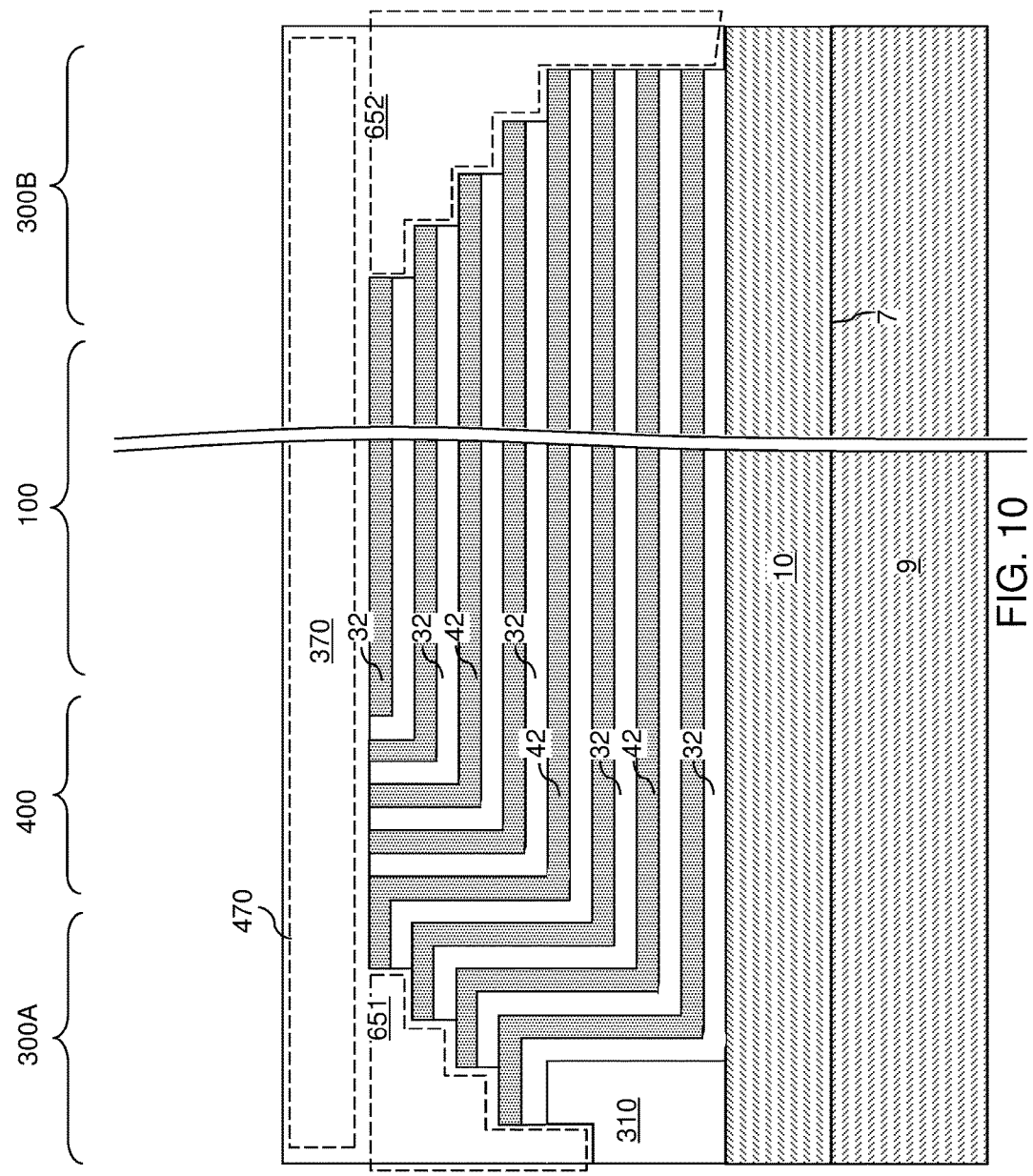
FIG. 10 is a schematic vertical cross-sectional view of the exemplary structure after formation of retro-stepped dielectric material portions according to an embodiment of the present disclosure.

Referring to FIG. 10, a retro-stepped dielectric material portions (651, 652) (i.e., an insulating fill material portions) can be formed in each stepped cavity by deposition of a dielectric material therein. For example, a dielectric material such as silicon oxide can be deposited in the stepped cavities and over the alternating stack (32, 42). The deposited dielectric material can be planarized to remove, or reduce, topographical variations in the top surface thereof, for example, by chemical mechanical planarization (CMP). Each remaining portion of the deposited dielectric material filling the stepped cavity constitutes the retro-stepped dielectric material portions (651, 652). As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion, the silicon oxide of the retro-stepped dielectric material portions (651, 652) may, or may not, be doped with dopants such as B, P, and/or F.

The portion of the deposited dielectric material overlying the first stepped surfaces and the dielectric mesa structure 310 constitutes a first retro-stepped dielectric material portion 651. The portion of the deposited dielectric material overlying the second stepped surfaces and contacting the top surface of the substrate (9, 10) constitutes a second retro-stepped dielectric material portion 652. Each of the first and second retro-stepped dielectric material portions (651, 652) can extend up to the horizontal plane including the topmost surface of the alternating stack (32, 42). In case a horizontal layer of the deposited dielectric material is present on, and over, the alternating stack (32, 42) and over the first and second retro-stepped dielectric material portions (651, 652), the horizontal layer of the deposited dielectric material is herein referred to as a contact level dielectric material layer 370. The thickness of the contact level dielectric material layer 370, if present, can be in a range from 50 nm to 600 nm, although lesser and greater thicknesses can also be employed. Alternatively, the deposited dielectric material can be removed from above the alternating stack (32, 42), and the contact level dielectric material layer 370 can be omitted.

Figure 11:
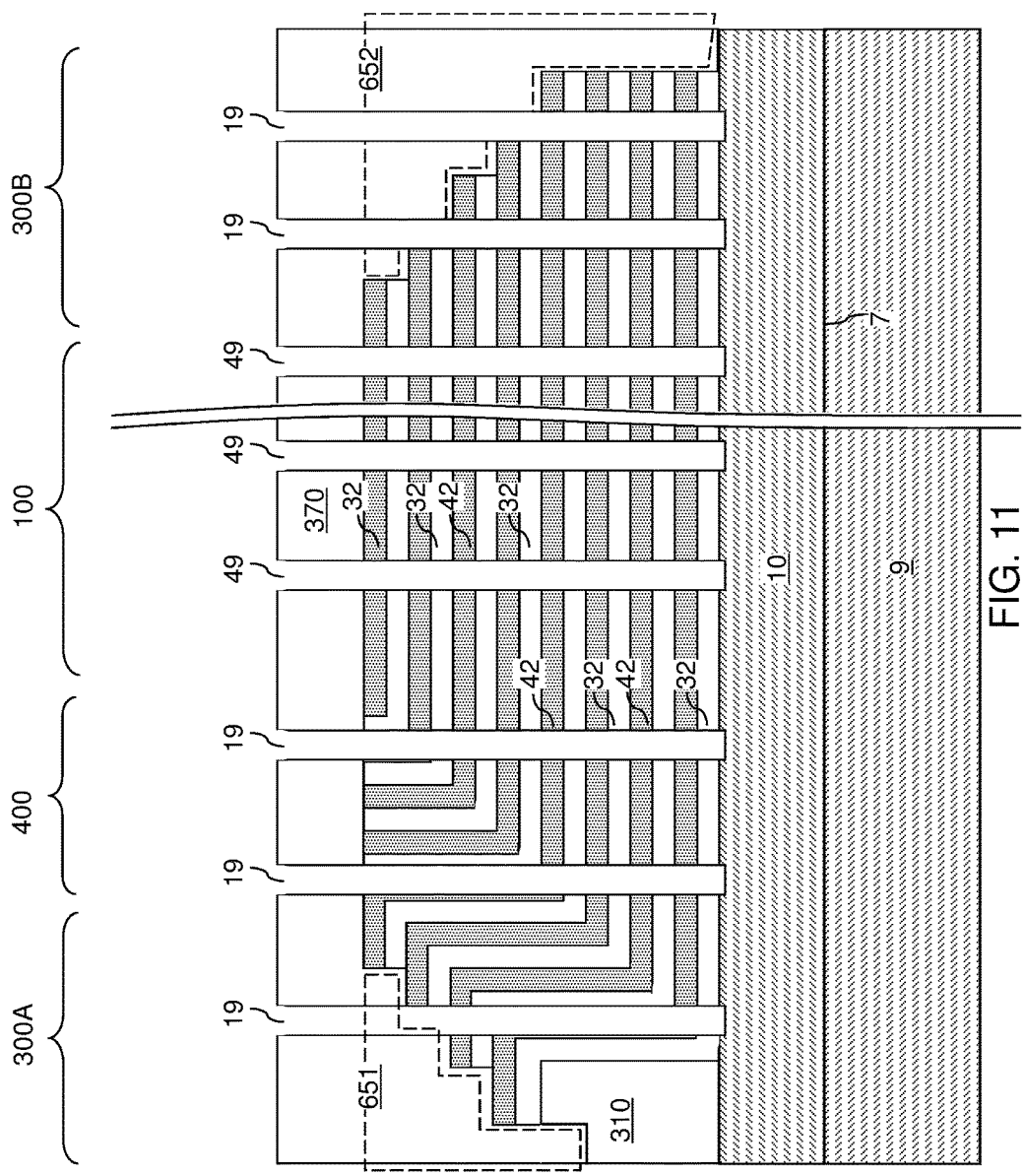
FIG. 11 is a schematic vertical cross-sectional view of the exemplary structure after formation of memory openings and support openings according to an embodiment of the present disclosure.

Referring to FIG. 11, a lithographic material stack (not shown) including at least a photoresist layer can be formed over the contact level dielectric material layer 370 and the retro-stepped dielectric material portions (651, 652), and can be lithographically patterned to form openings therein. The openings include a first set of openings formed over the memory array region 100 and a second set of openings formed over the contact regions (300A, 300B). The pattern in the lithographic material stack can be transferred through the contact level dielectric material layer 370 or the retro-stepped dielectric material portions (651, 652), and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the contact level dielectric material layer 370 and the entirety of the alternating stack (32, 42) in the memory array region 100. The support openings 19 are formed through the retro-stepped dielectric material portions (651, 652) and the portion of the alternating stack (32, 42) that underlie the stepped surfaces in the contact regions (300A, 300B).

The memory openings 49 extend through the entirety of the alternating stack (32, 42). The support openings 19 can extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the unrecessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact regions (300A, 300B). The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 12A-12H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 12A, a memory opening 49 in the exemplary device structure of FIG. 11 is illustrated. The memory opening 49 extends through the contact level dielectric material layer 370, the alternating stack (32, 42), and optionally into an upper portion of the semiconductor material layer 10. At this processing step, each support opening 19 can extend through the retro-stepped dielectric material portions (651, 652), a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch. The structure of each support opening 19 can be the same as the structure of a memory opening 49 except for replacement of horizontally extending portions of a subset of layers in the alternating stack (32, 42) with vertically extending portions of the alternating stack (32, 42) and, in some cases, with a retro-stepped dielectric material portion (651, 652) around each support opening 19.

Referring to FIG. 12B, an optional epitaxial channel portion (e.g., an epitaxial pedestal) 11 can be formed at the bottom portion of each memory opening 49 and each support openings 19, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Figure 12C:
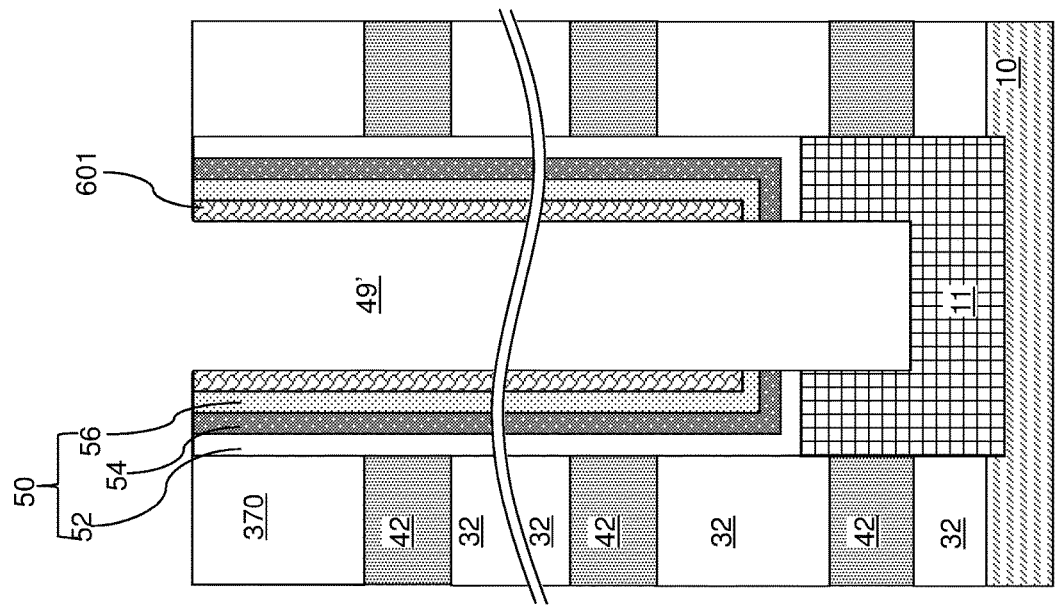

Referring to FIG. 12C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein.

The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Figure 12D:
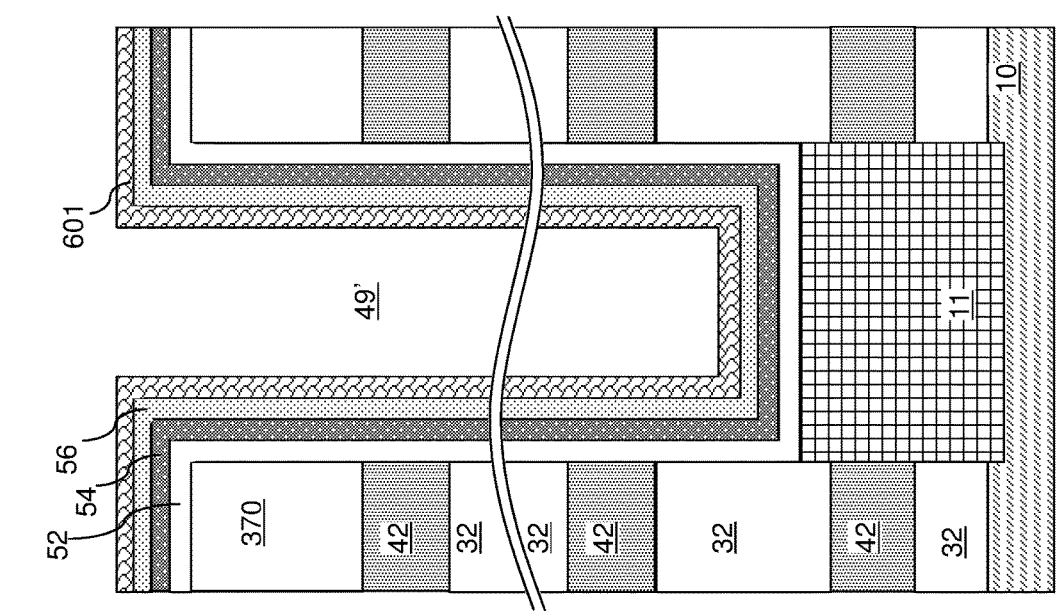

Referring to FIG. 12D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the contact level dielectric material layer 370 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 12F:
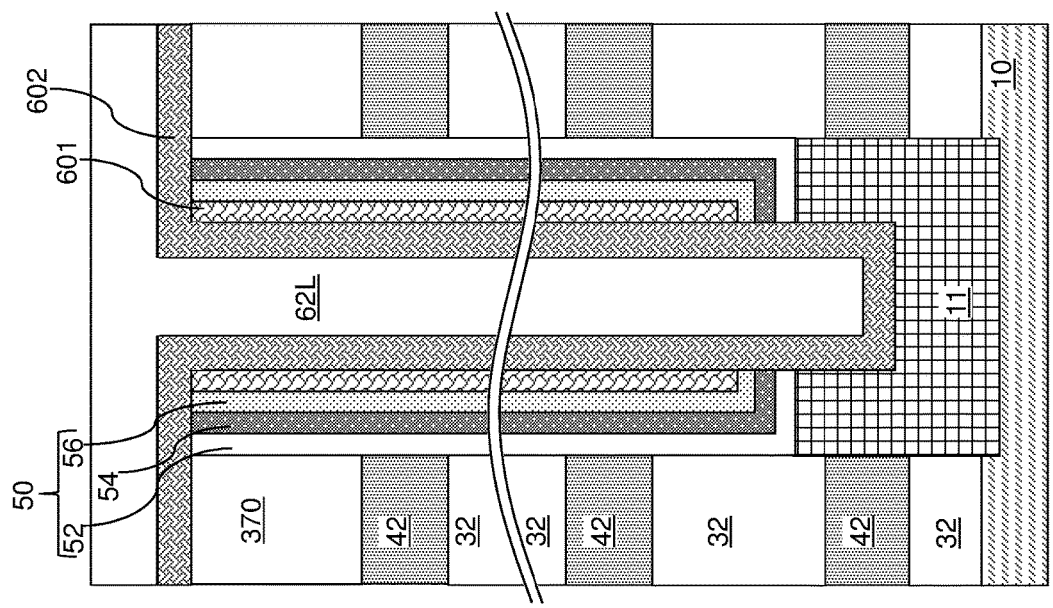
Figure 12E:
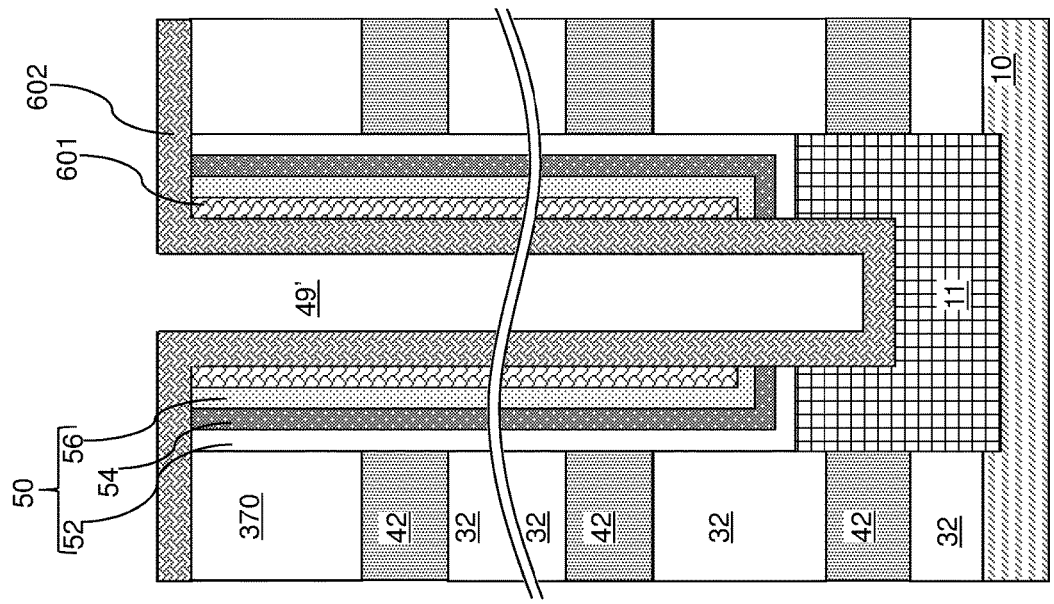

Referring to FIG. 12E, a second semiconductor channel layer 602 can be deposited directly on the semiconductor surface of the epitaxial channel portion 11 or the semiconductor substrate layer 10 if the epitaxial channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 12F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 12G, the horizontal portion of the dielectric core layer 62L can be removed, for example, by a recess etch from above the top surface of the contact level dielectric material layer 370. Each remaining portion of the dielectric core layer 62L constitutes a dielectric core 62. Further, the horizontal portion of the second semiconductor channel layer 602 located above the top surface of the contact level dielectric material layer 370 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 12H, the top surface of each dielectric core 62 can be further recessed within each memory opening, for example, by a recess etch to a depth that is located between the top surface of the contact level dielectric material layer 370 and the bottom surface of the contact level dielectric material layer 370. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the contact level dielectric material layer 370, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of an epitaxial channel portion 11 (if present), a memory stack structure 55, a dielectric core 62, and a drain region 63 within a memory opening 49 is herein referred to as a memory opening fill structure (11, 55, 62, 63). Each combination of an epitaxial channel portion 11 (if present), a memory film 50, a vertical semiconductor channel 60, a dielectric core 62, and a drain region 63 within each support opening 19 fills the respective support openings 19, and constitutes a support pillar structure 20. See FIG. 13.

Figure 13:
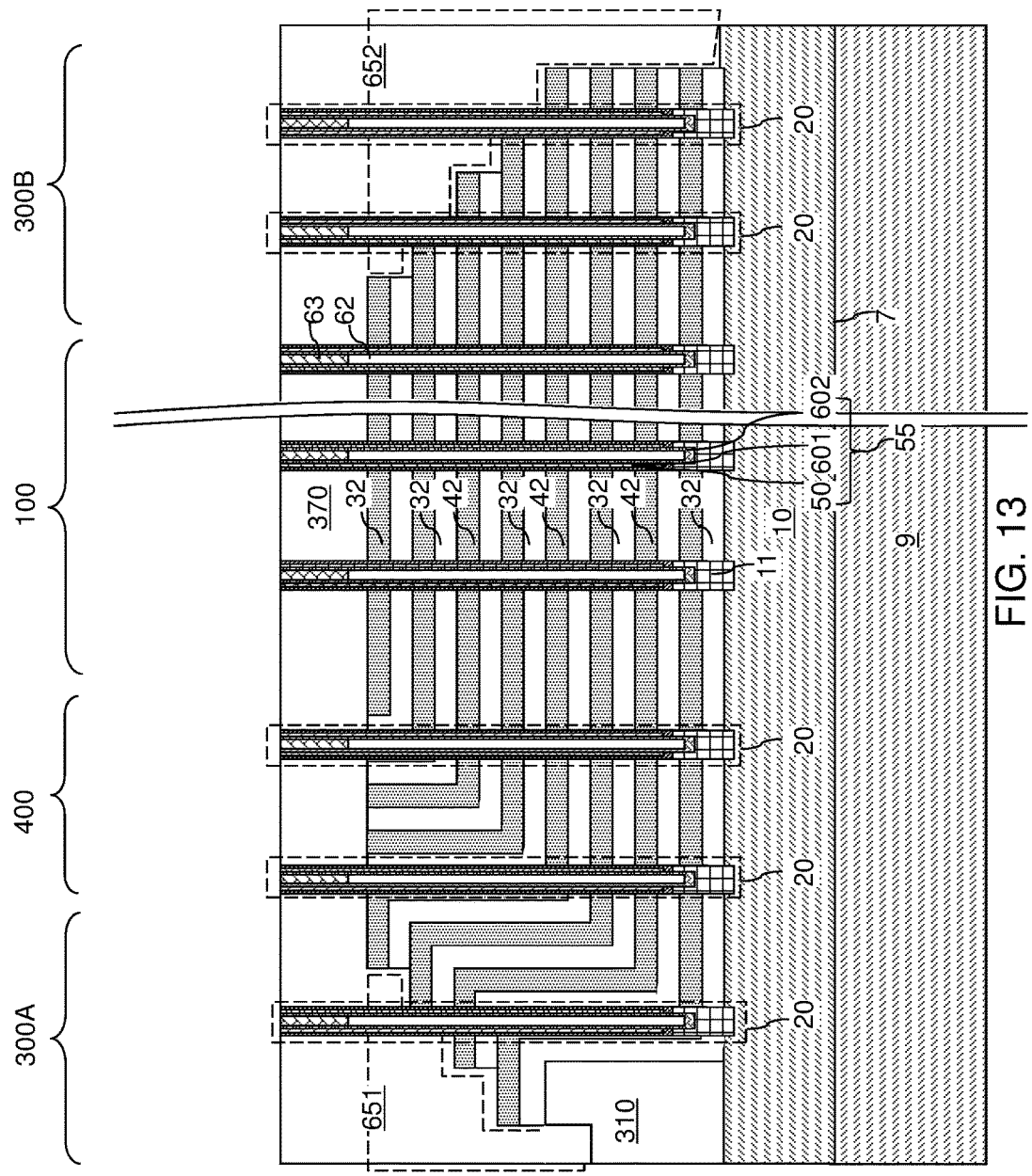
FIG. 13 is a schematic vertical cross-sectional view of the exemplary structure after formation of memory stack structures and support pillar structures according to an embodiment of the present disclosure.

Referring to FIG. 13, the exemplary structure is illustrated after formation of memory opening fill structures (11, 55, 62, 63) and support pillar structures 20 within the memory openings 49 and the support openings 19, respectively. An instance of a memory opening fill structure (11, 55, 62, 63) can be formed within each memory opening 49 of the structure of FIG. 11. An instance of the support pillar structure 20 can be formed within each support opening 19 of the structure of FIG. 11.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 14A:
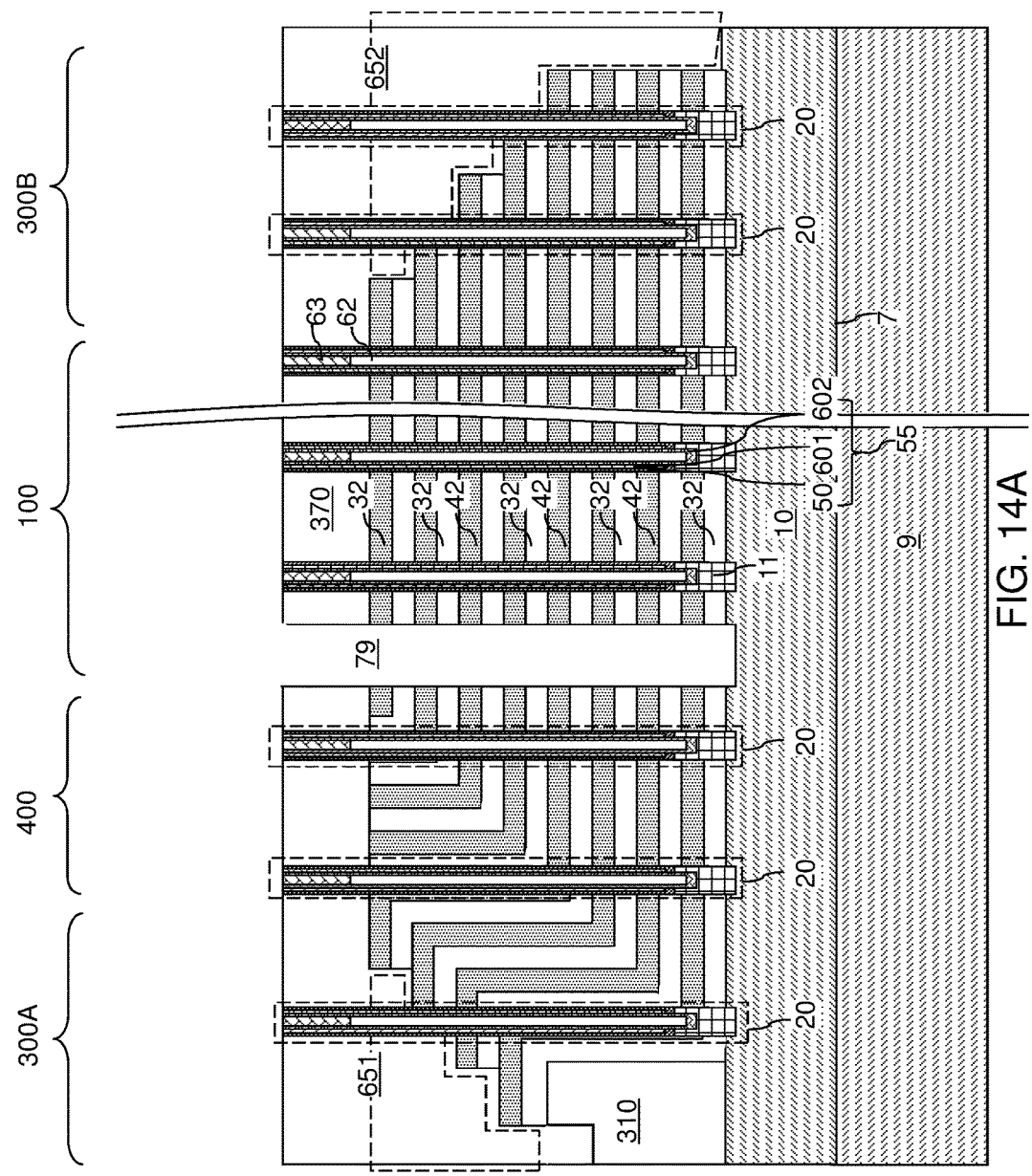
FIG. 14A is a schematic vertical cross-sectional view of the exemplary structure after formation of backside trenches according to an embodiment of the present disclosure.
Figure 14B:
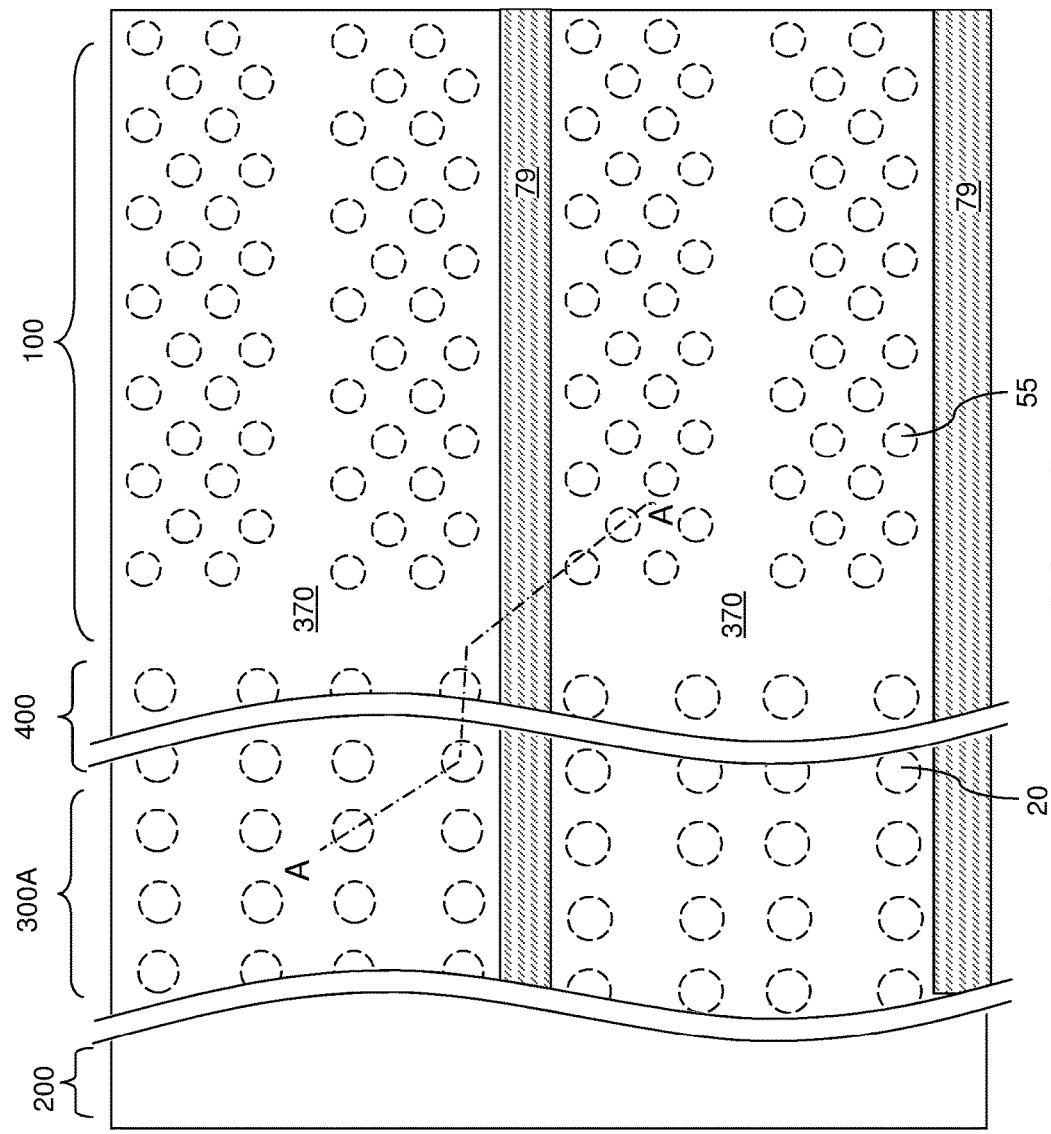
FIG. 14B is a partial see-through top-down view of the exemplary structure of FIG. 14A. The vertical plane A-A' is the plane of the schematic vertical cross-sectional view of the left side of FIG. 14A.

Referring to FIGS. 14A and 14B, a photoresist layer (not shown) can be applied over the contact level dielectric layer 370, and is lithographically patterned to form openings in areas between clusters of memory stack structures 55. The pattern in the photoresist layer can be transferred through the contact level dielectric layer 370, the alternating stack (32, 42) and/or the retro-stepped dielectric material portions (651, 652) employing an anisotropic etch to form backside trenches 79, which vertically extend from the top surface of the contact level dielectric layer 370 at least to the top surface of the substrate (9, 10), and laterally extend through the memory array region 100 and the contact regions (300A, 300B). In one embodiment, the backside trenches 79 can include a source contact opening in which a source contact via structure can be subsequently formed. The photoresist layer can be removed, for example, by ashing.

Figure 15:
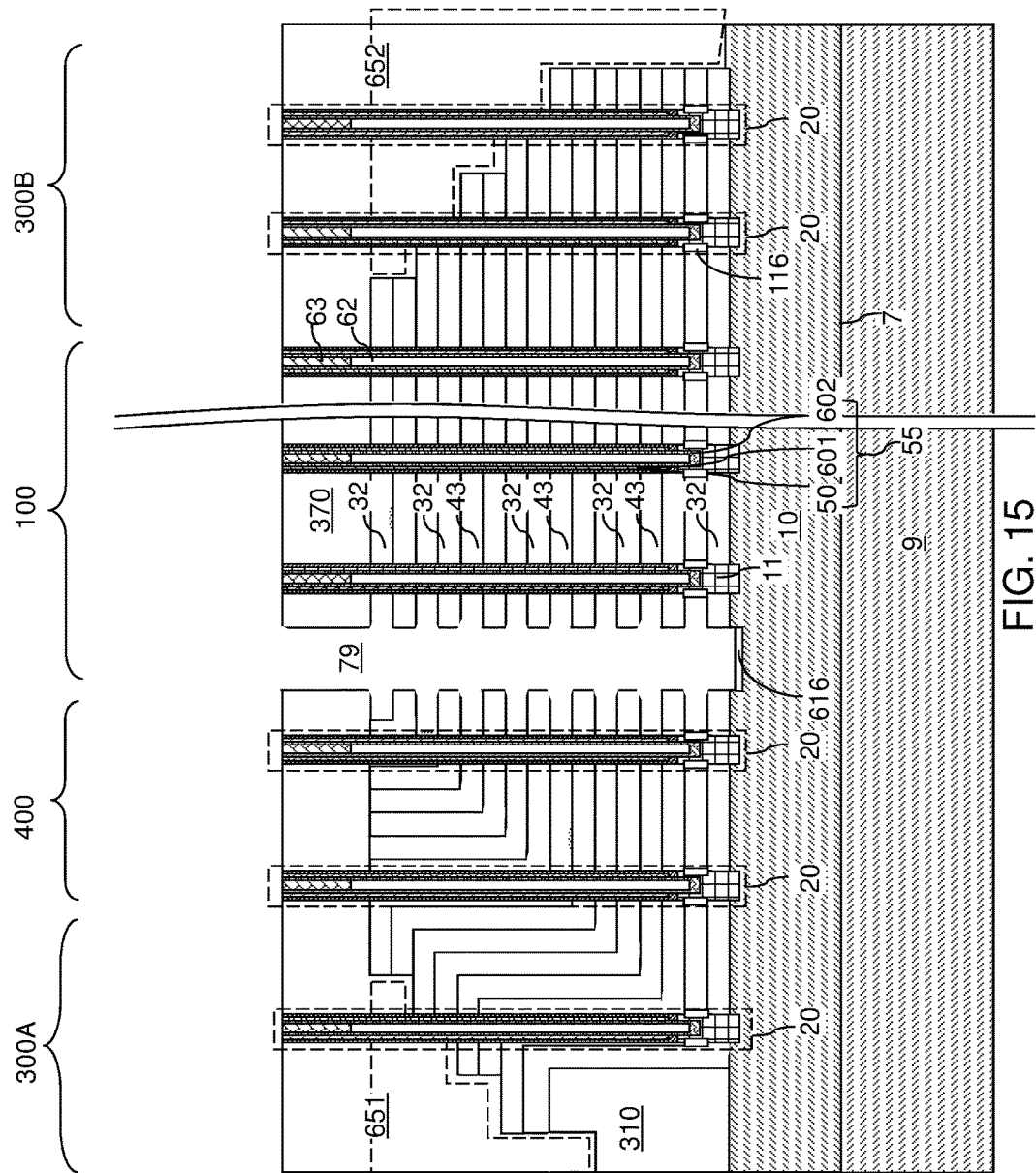
FIG. 15 is a schematic vertical cross-sectional view of the exemplary structure after formation of backside recesses according to an embodiment of the present disclosure.

Referring to FIGS. 15 and 16A, an etchant that selectively etches the second material of the sacrificial material layers 42 with respect to the first material of the insulating layers 32 can be introduced into the backside trenches 79, for example, employing an etch process. FIG. 16A illustrates a region of the exemplary structure of FIG. 15. Backside recesses 43 are formed in volumes from which the sacrificial material layers 42 are removed. The removal of the second material of the sacrificial material layers 42 can be selective to the first material of the insulating layers 32, the material of the retro-stepped dielectric material portions (651, 652), the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portions (651, 652) can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 20, the retro-stepped dielectric material portions (651, 652), and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 16B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The thickness of the backside blocking dielectric layer 44 can be in a range from 1 nm to 10 nm, although lesser and greater thicknesses can also be employed. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 16C:
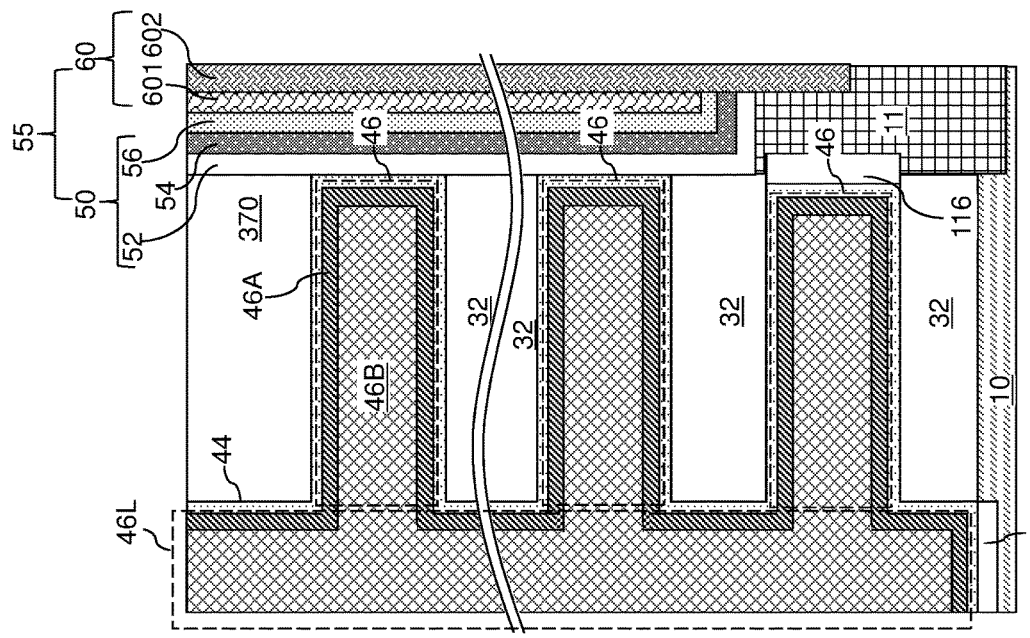

Referring to FIG. 16C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 16D:
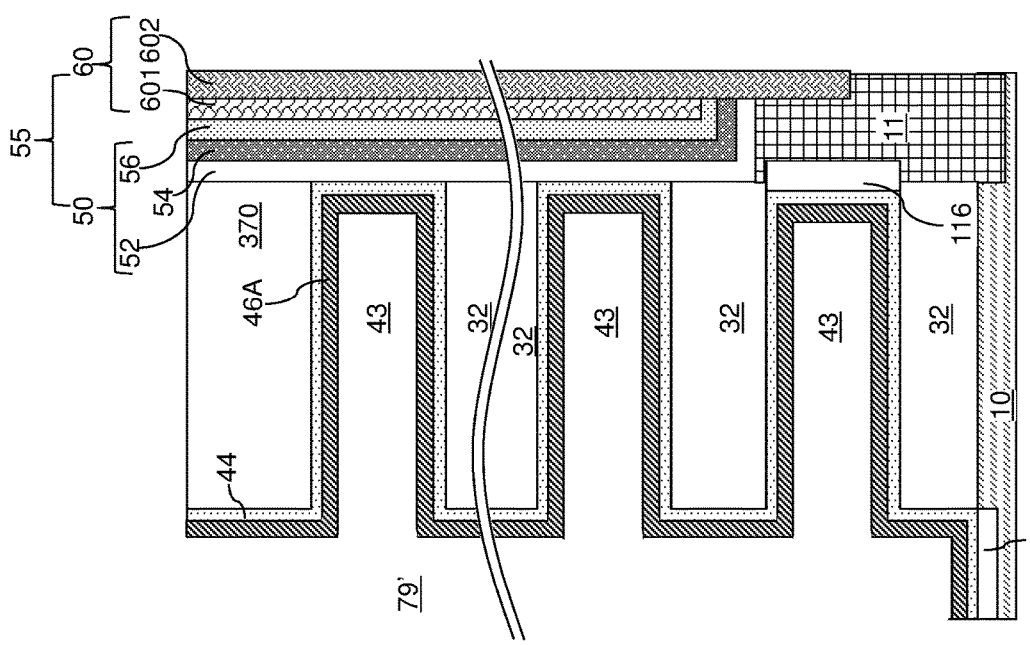
Figure 17:
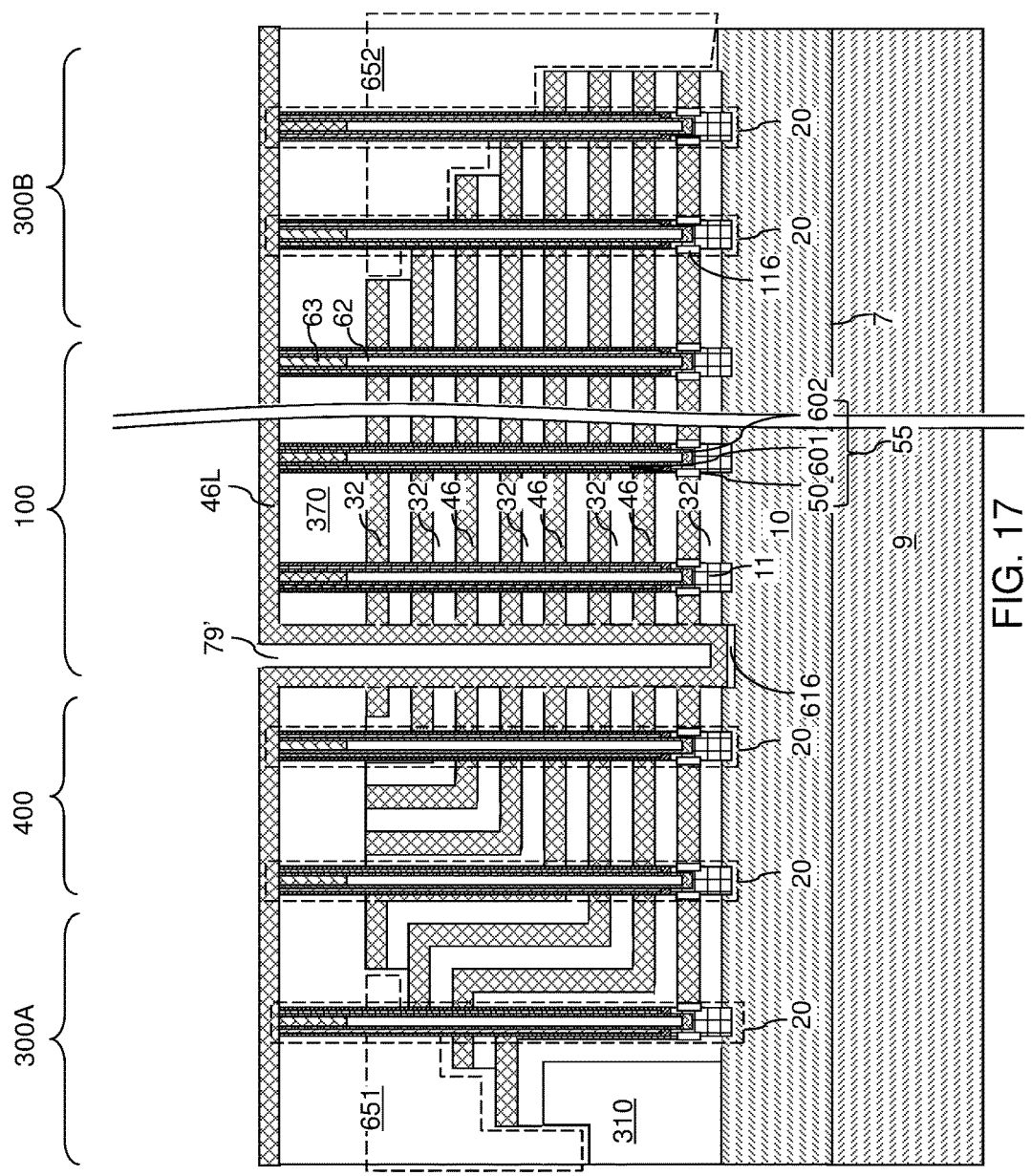
FIG. 17 is a schematic vertical cross-sectional view of the exemplary structure at the processing step of FIG. 16D.

Referring to FIGS. 16D and 17, a metal fill material is deposited in the plurality of backside recesses 43, on the sidewalls of the at least one the backside trench 79, and over the top surface of the contact level dielectric layer 370 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 370. Each electrically conductive layer 46 includes a portion of the metallic barrier layer 46A and a portion of the metallic fill material layer 46B that are located between a vertically neighboring pair of dielectric material layers, which can be a pair of insulating layers 32, or a topmost insulating layer and the contact level dielectric material layer 370. The continuous metallic material layer 46L includes a continuous portion of the metallic barrier layer 46A and a continuous portion of the metallic fill material layer 46B that are located in the backside trenches 79 or above the contact level dielectric layer 370.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds an epitaxial channel portion 11. A bottommost electrically conductive layer 46 laterally surrounds each tubular dielectric spacer 116 upon formation of the electrically conductive layers 46.

Figure 18:
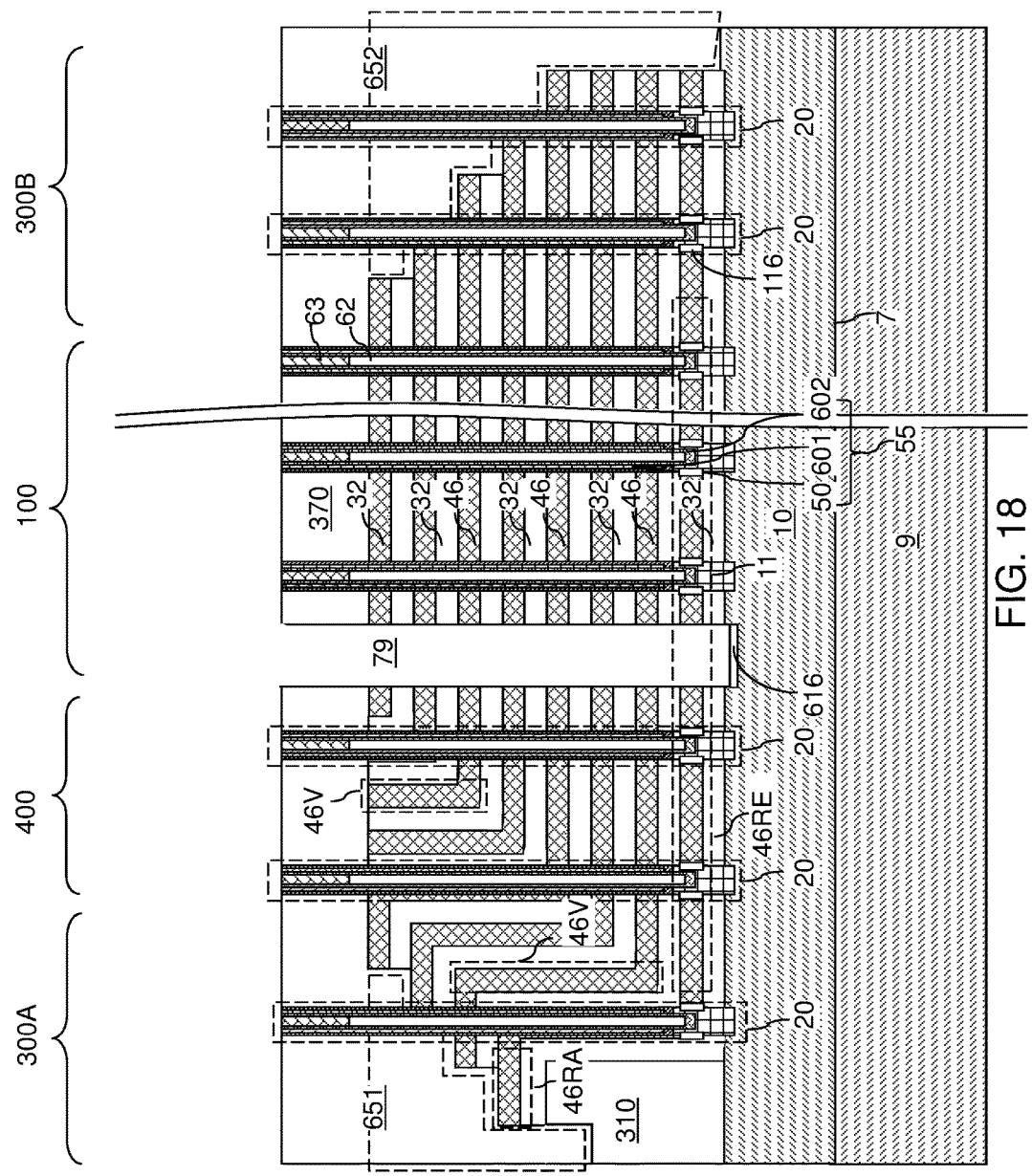
FIG. 18 is a schematic vertical cross-sectional view of the exemplary structure after removal of a deposited conductive material from within the backside trenches according to an embodiment of the present disclosure.

Referring to FIG. 18, the deposited metallic material of the continuous electrically conductive material layer 46L is etched back from the sidewalls of each backside trench 79 and from above the contact level dielectric layer 370, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. A backside cavity 79' is present within each backside trench 79.

An alternating stack of insulating layers 32 and electrically conductive layers 46 is formed over the substrate (9, 10). The alternating stack (9, 10) is composed of, from bottom to top, a first contiguous subset of layers within the alternating stack (32, 46) that is derived from the first contiguous subset of the alternating stack (32, 42) as previously provided, and a second contiguous subset of layers that is a complementary subset of the first contiguous subset, i.e., the contiguous subset of layers that is derived from the second contiguous subset of the alternating stack (32, 42) as previously provided.

In the memory array region 100, a first subset of electrically conductive layers 46 (e.g., lower word lines) is located below a second subset of electrically conductive layer 46 (e.g., upper word lines). The electrically conductive layers 46 in the first subset are located adjacent to lower portions of the memory stack structures 55 located in the memory array region 100. The electrically conductive layers 46 in the second subset are located adjacent to upper portion which are positioned above the lower portions of the memory stack structures 55 located in the memory array region 100. Each electrically conductive layer (e.g., lower word line layer) 46 in the first subset is located below the electrically conductive layers (e.g., upper word line layer) 46 in the second subset in the memory array region 100. Each electrically conductive layer 46 in the first subset has a raised portion 46RA located over the mesa structure 310 in the first contact region 300A which is farther away from the top surface 7 of the substrate than a recessed portion 46RE of the same electrically conductive layer 46 located in the memory array region 100 to the side of the mesa structure 310. The raised portion 46RA and the recessed portion 46RE of each electrically conductive layer 46 may extend horizontally (i.e., parallel to the top surface 7 of the substrate). Each electrically conductive layer 46 in the first subset also contains a connecting portion 46V located in the transition region 400 and/or in the first contact region 300A. The connecting portion 46V may extend over the sidewall of the mesa structure 310 and connects the recessed portion 46RE to the raised portion 46RA of the same electrically conductive layer 46. The connecting portion 46V may be a non-horizontal portion, such as a vertical portion. In one embodiment, each electrically conductive layer 46 except a topmost electrically conductive layer 46 in the alternating stack (32, 46) includes a respective connecting portion, such as a vertically extending portion 46V within the first contact region 300A and/or the transition region 400 located between the memory array region 100 and the first contact region 300A. Each electrically conductive layer 46 within the second contiguous subset of insulating layers 32 and the electrically conductive layers 46 includes a respective vertically extending portion 46V having a planar topmost surface located within a same horizontal plane as a topmost surface of the alternating stack (32, 46). An upper end of a vertically extending portion 46V of each electrically conductive layer 46 within the first contiguous subset is adjoined to an upper horizontal portion (e.g., the raised portion 46RA) located above a horizontal plane including a top surface of the mesa structure 310. A lower end of the vertically extending portion 46V of each electrically conductive layer 46 within the first contiguous subset is adjoined to a lower horizontal portion (e.g., the recessed portion 46RE) that continuously extends through the memory array region 100 and into the second terrace region including the second stepped surfaces 329B. In one embodiment, for each electrically conductive layer 46 within the first contiguous subset, the thickness of the upper horizontal portion and the thickness of the lower horizontal portion, and the optionally the lateral width of the vertically extending portion can be the same.

Figure 19A:
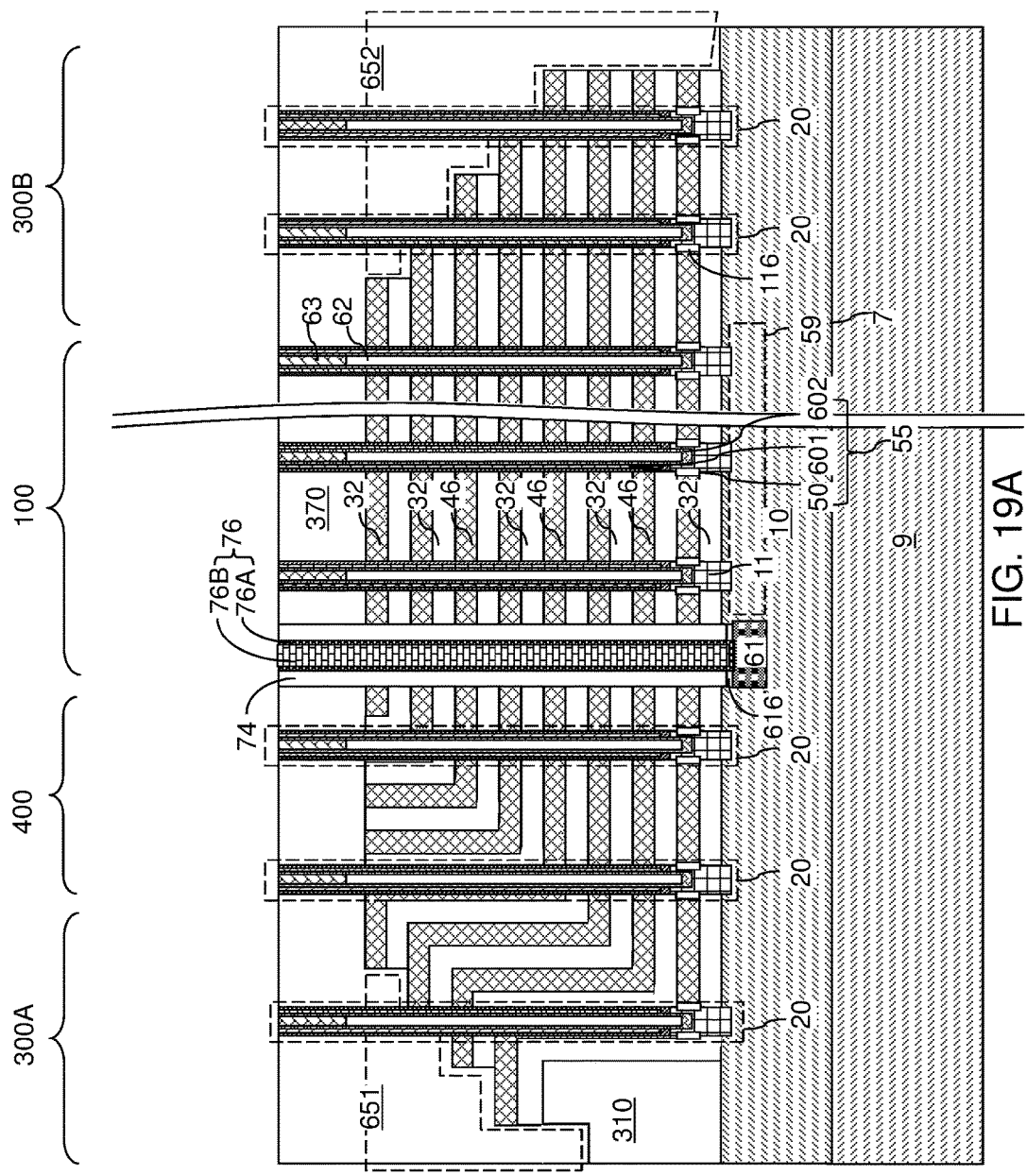
FIG. 19A is a schematic vertical cross-sectional view of the exemplary structure after formation of an insulating spacer and a backside contact structure within each backside trench according to an embodiment of the present disclosure.

Referring to FIGS. 19A and 19B, an insulating material layer can be formed in the at least one backside trench 79 and over the contact level dielectric layer 370 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 370 and at the bottom of each backside trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. An opening is formed though the planar dielectric portion 616 underneath each backside cavity 79', thereby vertically extending the backside cavity 79'. A top surface of the semiconductor material layer 10 can be physically exposed at the bottom of each backside trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 370 overlying the alternating stack (32, 46) as a stopping layer. If chemical mechanical planarization (CMP) process is employed, the contact level dielectric layer 370 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 20B:
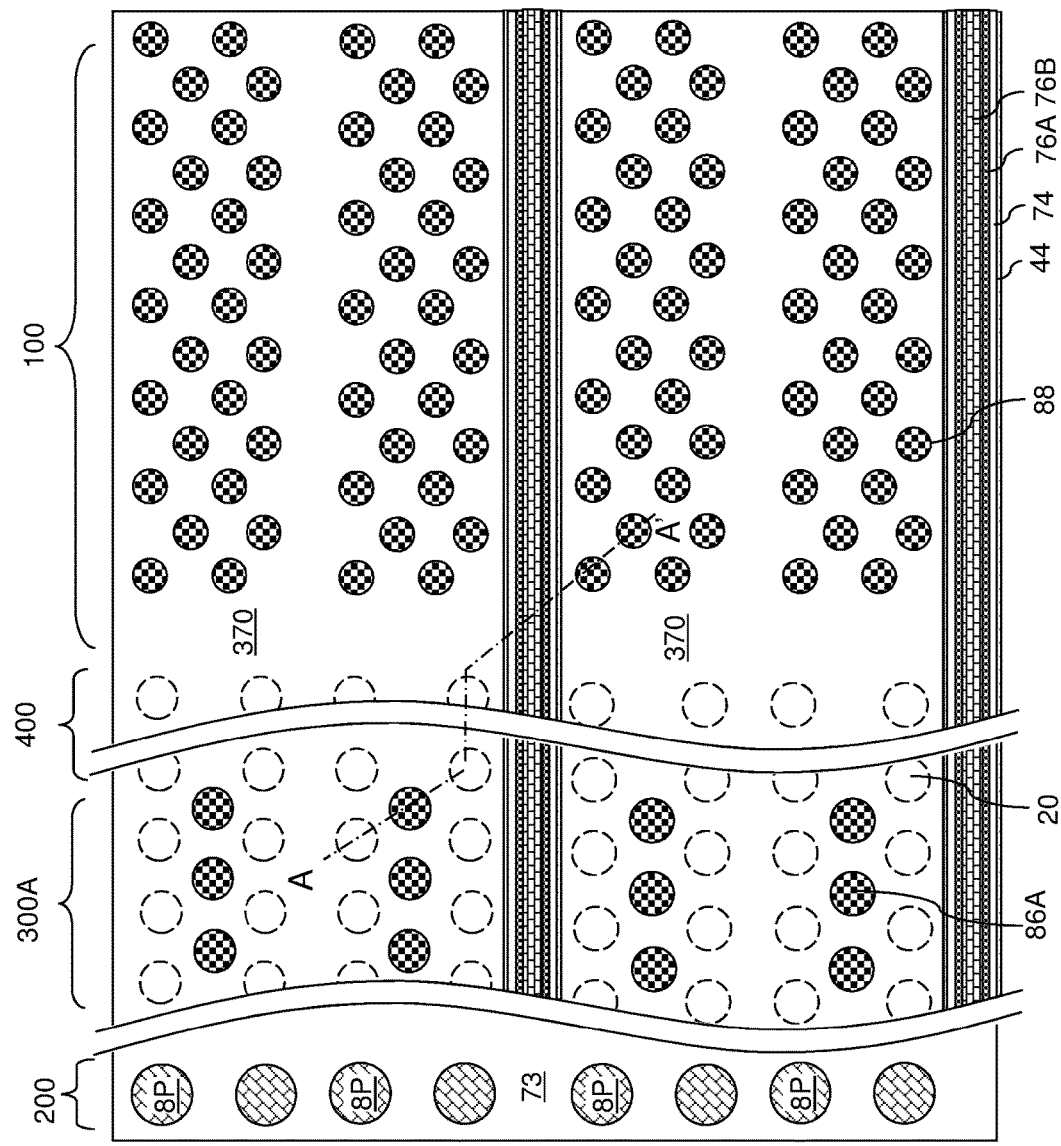
FIG. 20B is a top-down view of the exemplary structure of FIG. 20A. The vertical plane A-A' is the plane of the schematic vertical cross-sectional view of the left side FIG. 20A.

Referring to FIGS. 20A and 20B, additional contact via structures (88, 86A, 86B, 8P) can be formed through the contact level dielectric layer 370, and optionally through the retro-stepped dielectric material portions (651, 652). For example, drain contact via structures 88 can be formed through the contact level dielectric layer 370 on each drain region 63. Word line contact via structures (86A, 86B) can be formed on the electrically conductive layers 46 through the contact level dielectric layer 370, and through the retro-stepped dielectric material portions (651, 652). As shown in FIG. 20B, peripheral device contact via structures 8P can be formed through the retro-stepped dielectric material portions (651, 652) directly on respective nodes of the peripheral devices.

The word line contact via structures (86A, 86B) can include first contact via structures 86A that extend through the first retro-stepped dielectric material portion 651 and to horizontal portions (i.e., first terraces) 331A of the first stepped surfaces 329A and contact a respective one of the electrically conductive layers 46 within the first contiguous subset of the alternating stack (32, 46). In other words, the first word line contact via structures 86A contact a raised portion 46RA of each electrically conductive layer (e.g., word line) 46 in the first subset located over the mesa structure 310 in the first contact region 300A. Further, the word line contact via structures (86A, 86B) can include second contact via structures 86B that extend through the second retro-stepped dielectric material portion 652 and to horizontal portions (i.e., second terraces) 331B of the second stepped surfaces 329B and contact a respective one of the electrically conductive layers 46 within the second contiguous subset of the alternating stack (32, 46). Each of the first contact via structures 86A is formed above a horizontal plane including the horizontal top surface of the dielectric mesa structure 310. Each of the second contact via structures 86B is formed above a horizontal plane including a bottommost surface of the second contiguous subset of the alternating stack (32, 46). Preferably, the second contact via structures 86B do not contact the electrically conductive layers 46 of the first subset in the second contact region 300B.

The exemplary structure can include a three-dimensional memory device. The three-dimensional memory device includes: an alternating stack of insulating layers 32 and electrically conductive layers 46 located over a substrate (9, 10), wherein the alternating stack is composed of, from bottom to top, a first contiguous subset of layers within the alternating stack and a second contiguous subset of layers that is a complementary subset of the first contiguous subset; a mesa structure, such as a dielectric mesa structure 310 located on over the substrate (9, 10) and including a horizontal top surface; memory stack structures 55 extending through a memory array region 100 of the alternating stack (32, 46); a first terrace region located at a first side of the memory array region 100 and including first stepped surfaces 329A that include horizontal 331A and non-horizontal connecting surfaces (which may be vertical surfaces) of the first contiguous subset and is located above the dielectric mesa structure 310; and a second terrace region located at a second side of the memory array region 100 and including second stepped surfaces 329B that include horizontal 331B and non-horizontal connecting surfaces (which may be vertical surfaces) of the second contiguous subset.

In one embodiment, the dielectric mesa structure 310 can have a height that is in a range from 40% to 60% and the total thickness of the alternating stack (32, 46). A bottom edge of the first stepped surfaces can contact a top surface of the dielectric mesa structure 310.

In one embodiment shown in FIG. 20A, each horizontal surface of the second stepped surfaces can be located above a horizontal plane H4 located at a distance of at least 40% of the total thickness of the alternating stack from the horizontal plane including the topmost surface of the substrate (9, 10).

In one embodiment, each layer within the first contiguous subset includes a respective horizontal portion that underlies the second stepped surfaces. A contiguous set of sidewalls (such as the vertically coincident sidewalls VCS) of the first contiguous subset vertically extend from a topmost surface of the substrate (9, 10) to a bottom edge of the second stepped surfaces.

In one embodiment, the first contact via structures 86A contact respective electrically conductive layers 46 within the first contiguous subset in the first terrace region, and the second contact via structures 86B contact respective electrically conductive layers 46B within the second contiguous subset in the second terrace region.

Furthermore, as shown in FIGS. 20A and 20B, the three-dimensional memory device includes an alternating stack of insulating layers 32 and word line layers 46 located over a substrate (9, 10). The word line layers 46 comprise upper word line layers and lower word line layer located under the upper word line layers in a memory array region 100. A mesa structure 310 is located over the substrate in a first contact region 300A. Memory stack structures 55 extend through the alternating stack (32, 46) in the memory array region 100. Each of the memory stack structures 55 comprises a memory film 50 and a vertical semiconductor channel 60. A first terrace region is located above the mesa structure in the first contact region 300A at a first side of the memory array region 100, and includes first stepped surfaces 329A containing respective horizontal surfaces 331A of the lower word line layers. First word line contact via structures 86 contact the respective horizontal surfaces 331A of the lower word line layers 46 in the first terrace region.

A second terrace region is located in a second contact region 300B at a second side of the memory array region 100, and includes second stepped surfaces 329B containing respective horizontal surfaces 331B of the upper word line layers 46. Second word line contact via structures 86B contact the respective horizontal surfaces 331B of the upper word line layers 46 in the second terrace region.

Each lower word line layer 46 comprises a raised portion 46RA located over the mesa structure 310 in the first contact region 300A, a recessed portion 46RE located in the memory array region 100 to the side of the mesa structure, and a connecting portion 46V which extends over a sidewall of the mesa structure 310 and connects the recessed portion to the raised portion. In one embodiment, the lower word line layers 46 do not have stepped surfaces in the second contact region 300B and no word line contact via structures 86A, 86B contact the lower word line layers in the second contact region 300B. In one embodiment, the upper word line layers 46 are not located over the mesa structure 310.

The exemplary structure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

Formation of the dielectric mesa structure 310 and subsequent formation of the alternating stack (32, 46) partly over the dielectric mesa structure 310 vertically shifts the distance between the first contiguous subset of the alternating stack (32, 46) such that the vertical distance from the contact level dielectric layer 370 to the electrically conductive layers 46 within the first contiguous subset (which can be the lower half) of the alternating stack (32, 46) decreases over the dielectric mesa structure 310. By forming the word line contact via structures to the electrically conductive layers 46 within the first contiguous subset of the alternating stack (32, 46) over the dielectric mesa structure 310, the maximum height of the word line contact via structures (i.e., the first contact via structures 86A) to the electrically conductive layers 46 can be reduced by about one half of the total height of the alternating stack (32, 46) compared to prior art methods for forming word line contact via structures. The word line contact via structures 86B to the electrically conductive layers 46 within the second contiguous subset (which can be the upper half) of the alternating stack (32, 46) can be formed concurrently with formation of the word line contact via structures to the electrically conductive layers 46 within the first contiguous subset, thereby minimizing the number of processing steps and processing cost.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers located over a substrate, wherein the alternating stack is composed of, from bottom to top, a first contiguous subset of layers within the alternating stack and a second contiguous subset of layers;
    a mesa structure located over the substrate;
    memory stack structures extending through the alternating stack in a memory array region, wherein each of the memory stack structures comprises a memory film and a vertical semiconductor channel;
    a first terrace region located above the mesa structure at a first side of the memory array region, and including first stepped surfaces of the first contiguous subset;
    a second terrace region located at a second side of the memory array region, and including second stepped surfaces of the second contiguous subset;
    first contact via structures contacting respective electrically conductive layers within the first contiguous subset in the first terrace region;
    second contact via structures contacting respective electrically conductive layers within the second contiguous subset in the second terrace region;
    a first retro-stepped dielectric material portion contacting the first stepped surfaces;
    a second retro-stepped dielectric material portion contacting the second stepped surfaces, wherein the second retro-stepped dielectric material portion has a greater maximum height than the first retro-stepped dielectric material portion;
    a contact level dielectric material layer overlying the alternating stack;
    a first support pillar structure located in the first terrace region and extending through the contact level dielectric material layer and the first retro-stepped dielectric material portion, not extending through any layer within the second contiguous subset, and directly contacting a horizontal portion of an electrically conductive layer within the first contiguous subset, a horizontal portion of an insulating layer within the first contiguous subset, and a vertically extending portion of another electrically conductive layer within the first contiguous subset, wherein the vertically extending portion extends vertically over a vertical extent of multiple electrically conductive layers within the memory array region; and
    a second support pillar structure located in the second terrace region and extending through the contact level dielectric material layer and the second retro-stepped dielectric material portion, and directly contacting a respective horizontal portion of each electrically conductive layer within the first contiguous subset and a horizontal portion of at least one electrically conductive layer within the second contiguous subset and does not directly contact any vertically extending portion of the electrically conductive layers within an entirety of the alternating stack.

2. The three-dimensional memory device of claim 1, wherein:
    the mesa structure has a height that is in a range from 40% to 60% and a total thickness of the alternating stack; and
    a bottom edge of the first stepped surfaces contacts a top surface of the mesa structure.

3. The three-dimensional memory device of claim 1, wherein:
    the first stepped surfaces include horizontal and non-horizontal connecting surfaces of the first contiguous subset;
    the second stepped surfaces include horizontal and non-horizontal connecting surfaces of the second contiguous subset; and
    each horizontal surface of the second stepped surfaces is located above a horizontal plane located at a distance of at least 40% of a total thickness of the alternating stack from a horizontal plane including a topmost surface of the substrate.

4. The three-dimensional memory device of claim 1, wherein:
each layer within the first contiguous subset includes a respective horizontal portion that underlies the second stepped surfaces; and
a contiguous set of sidewalls of the first contiguous subset extend from a topmost surface of the substrate to a bottom edge of the second stepped surfaces.

5. The three-dimensional memory device of claim 1, wherein:
the second contiguous subset of layers is a complementary subset of the first contiguous subset of layers; and
the mesa structure comprises a dielectric mesa structure having horizontal top surface.

6. The three-dimensional memory device of claim 1, wherein each electrically conductive layer in the first subset comprises:
an upper horizontal portion located above a horizontal plane including a top surface of the mesa structure;
a lower horizontal portion that continuously extends through the memory array region and into the second terrace region including the second stepped surfaces;
a respective non-horizontally extending connecting portion located in at least one of the first contact region and a transition region located between the memory array region and the first contact region;
an upper end of each respective non-horizontally extending connecting portion is adjoined to the upper horizontal portion; and
a lower end of each respective non-horizontally extending connecting portion is adjoined to the lower horizontal portion.

7. The three-dimensional memory device of claim 6, wherein:
for each electrically conductive layer within the first contiguous subset, a thickness of the upper horizontal portion and a thickness of the lower horizontal portion are the same; and
each electrically conductive layer within the second contiguous subset includes a respective vertically extending portion having a planar topmost surface located within a same horizontal plane as a topmost surface of the alternating stack.

8. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

9. The three-dimensional memory device of claim 1, wherein:
the first contact via structures comprise first word line contact via structures;
the second contact via structures comprise second word line contact via structures;
the electrically conductive layers within the first contiguous subset comprise lower word line layers;
the electrically conductive layers within the second contiguous subset comprise upper word line layers; and
the first word line contact via structures contact the respective horizontal surfaces of the lower word line layers in the first terrace region.

10. The three-dimensional memory device of claim 9, wherein the second word line contact via structures contact the respective horizontal surfaces of the upper word line layers in the second terrace region.

11. The three-dimensional memory device of claim 10, wherein:
each lower word line layer comprises a raised portion located over the mesa structure in the first contact region, a recessed portion located in the memory array region to the side of the mesa structure, and a connecting portion which extends over a sidewall of the mesa structure and connects the recessed portion to the raised portion;
the lower word line layers do not have stepped surfaces in the second contact region;
no word line contact via structures contact the lower word line layers in the second contact region; and
the upper word line layers are not located over the mesa structure.

12. The three-dimensional memory device of claim 1, wherein:
a bottom surface of the contact level dielectric material layer is located within a first horizontal plane including a topmost surface of the alternating stack and overlies each topmost surface of the electrically conductive layers; and
drain regions comprising a doped semiconductor material are located within an upper end of a respective one of the memory films and on an upper end of a respective one the vertical semiconductor channels and have top surfaces within a second horizontal plane including a top surface of the contact level dielectric material layer and have bottom surfaces between the first horizontal plane and the second horizontal plane.

13. The three-dimensional memory device of claim 12, wherein top surfaces of the first and second contact via structures are coplanar with top surfaces of the memory stack structures and top surface of the drain regions, and are located within the second horizontal plane.

14. The three-dimensional memory device of claim 12, wherein each memory film in the memory stack structures vertically extends through the contact level dielectric material layer to the second horizontal plane.

15. The three-dimensional memory device of claim 14, wherein:
- each of the first and second support pillar structures comprises a respective memory film having a same set of component layers as each of the memory films in the memory stack structures;
- each of the first and second support pillar structures comprises a respective vertical semiconductor channel having a same composition as each of the vertical semiconductor channel in the memory stack structures; and
- each of the first and second support pillar structures has a respective topmost surface within the second horizontal plane.

16. The three-dimensional memory device of claim 15, wherein the second retro-stepped dielectric material portion contacts a portion of a top surface of the substrate, and vertically extends between the portion of the top surface of the substrate and the first horizontal plane.

17. The three-dimensional memory device of claim 16, wherein the portion of the top surface of the substrate is within a same horizontal plane including a bottommost surface of a bottommost layer within the alternating stack.

18. The three-dimensional memory device of claim 12, wherein:
- the mesa structure comprises dielectric surfaces;
- the first retro-stepped dielectric material portion directly contacts at least one surface of the mesa structure;
- the mesa structure comprises a topmost surface, a vertical sidewall adjoining the topmost surface, and a recessed top surface adjoining the vertical sidewall;
- the first retro-stepped dielectric material portion contacts the vertical sidewall and the recessed top surface of the mesa structure; and
- a bottommost insulating layer within the alternating stack contacts the topmost surface of the mesa structure, another sidewall of the mesa structure, and a top surface of a semiconductor material in the substrate.

19. The three-dimensional memory device of claim 1, wherein:
- the first retro-stepped dielectric material portion and the second retro-stepped dielectric material portion are adjoined to the contact level dielectric material layer; and
- the first retro-stepped dielectric material portion, the second retro-stepped dielectric material portion and the contact level dielectric material layer comprise portions of the same deposited silicon oxide layer.

20. The three-dimensional memory device of claim 19, wherein a difference between the maximum height of the second retro-stepped dielectric material portion and a maximum height of the first retro-stepped dielectric material portion is non-zero and less than a maximum height of the mesa structure.

* * * * *